United States Patent
Fujioka et al.

(10) Patent No.: US 6,185,149 B1
(45) Date of Patent: Feb. 6, 2001

(54) SEMICONDUCTOR INTEGRATED CIRCUIT MEMORY

(75) Inventors: Shinya Fujioka; Masao Taguchi; Yasuharu Sato; Takaaki Suzuki; Tadao Aikawa; Yasurou Matsuzaki; Toshiya Uchida, all of Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/340,147

(22) Filed: Jun. 28, 1999

(30) Foreign Application Priority Data

Jun. 30, 1998 (JP) .................................................. 10-185097

(51) Int. Cl.$^7$ ...................................................... G11C 8/00
(52) U.S. Cl. .................. 365/233; 365/230.03; 365/238.5
(58) Field of Search .................................... 365/233, 220, 365/203, 238.5, 221, 239, 230.03

(56) References Cited

U.S. PATENT DOCUMENTS

| 5,386,385 | 1/1995 | Stephens, Jr. ................. 365/189.05 |
| 5,647,287 | 7/1997 | McLaury et al. ............... 365/230.01 |
| 5,703,828 | 12/1997 | Park et al. ...................... 365/230.03 |
| 5,781,499 | * 7/1998 | Kohikawa ........................... 365/233 |
| 5,808,959 | * 9/1998 | Kengeri et al. ..................... 365/233 |
| 5,812,488 | * 9/1998 | Zagar et al. ........................ 365/233 |
| 6,094,380 | * 7/1998 | Kim ..................................... 365/194 |

FOREIGN PATENT DOCUMENTS 0 778 575 A2    6/1997  (EP) .

OTHER PUBLICATIONS

International Publication No. WO 98/19248, published May 7, 1998.

* cited by examiner

Primary Examiner—Richard Elms
Assistant Examiner—Hien Nguyen
(74) Attorney, Agent, or Firm—Arent Fox Kitner Plotkin & Kahn PLLC

(57) ABSTRACT

A semiconductor memory includes memory cell blocks, a burst-length information generating circuit which generates burst-length information based on a burst length, and a block enable circuit which receives the burst-length information. The block enable circuit selectively enables one of the memory cell blocks when the burst length is equal to or shorter than a predetermined burst length and selectively enables a plurality of memory cell blocks based on the burst length when the burst length is longer than the predetermined burst length. Data are read from the above-mentioned one or plurality of memory cell blocks.

16 Claims, 20 Drawing Sheets

FIG. 10D
| FUSE | b18 | BURST LENGTH |
|---|---|---|
| NOT CUT | L | 4 |
| CUT | H | 8 |
FIG. 10E
| BONDING | b18 | BURST LENGTH |
|---|---|---|
| a | L | 4 |
| b | H | 8 |
FIG. 10F
| SWITCH | b18 | BURST LENGTH |
|---|---|---|
| a CONNECT | L | 4 |
| b CONNECT | H | 8 |
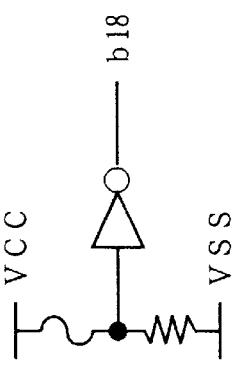
FIG. 10A
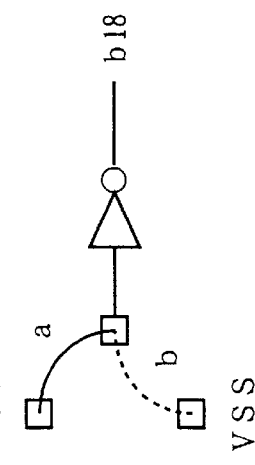
FIG. 10B
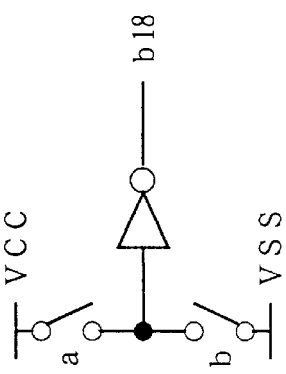
FIG. 10C

FIG. 12

|  | BL=4 | BL=2 | | BL=1 | | | |
|---|---|---|---|---|---|---|---|
| caa0, 1z | — | L/— | H/— | L/L | H/L | L/H | H/H |
| sw1n | close | close | open | close | open | open | open |
| sw2n | close | close | open | close | close | close | close |
| sw3n | close | close | close | close | close | close | close |
| sw24 | open | open | close | open | open | open | open |
| sw14 | open | open | open | open | open | open | close |
| sw13 | open | open | close | open | open | close | open |
| sw12 | open | open | open | open | close | open | open |

FIG. 15A

|  | BL=4 | BL=2 | BL=1 |
|---|---|---|---|
| outp0z<br>outp1z | clocking<br>clocking | clocking<br>clocking | clocking<br>— |

FIG. 15B

|  | BL=4 | BL=2 | BL=1 |
|---|---|---|---|
| psclk1z<br>psclk2z<br>psclk3z<br>psclk0z | clocking<br>clocking<br>clocking<br>clocking | clocking<br>clocking<br>—<br>— | clocking<br>—<br>—<br>— |

SEMICONDUCTOR INTEGRATED CIRCUIT MEMORY

BACKGROUND OF THE INVENTION

1. Field of the Invention

The present invention generally relates to semiconductor integrated circuit memories, and more particularly to a semiconductor integrated circuit memory which operates in synchronism with a clock.

Recently, semiconductor memory devices such as DRAM (Dynamic Random Access Memory) devices have been required to input and output data at higher frequencies in accordance with speeding up of CPUs so that the data transmission rate can be increased.

An SDRAM (Synchronous DRAM) device and FCRAM (Fast Cycle RAM) can operate at a high speed in synchronism with a clock signal supplied from the outside of the device.

2. Description of the Related Art

FIG. 1 illustrates a circuit configuration of a periphery of a memory cell of the SDRAM. The circuit shown in FIG. 1 includes a capacitor 201, NMOS (N-channel Metal Oxide Semiconductor) transistors 212, 223 and 224, and PMOS (P-channel MOS) transistors 213, 221 and 222. The PMOS transistors 221 and 222 and the NMOS transistors 223 and 224 form a sense amplifier 220.

The capacitor 201, which forms a memory cell, can store one-bit data. The data stored in the capacitor 201 is read onto a pair of data bus lines DB and /DB as follows.

FIG. 2 is a timing chart of a read operation of the SDRAM having the memory cell peripheral circuit shown in FIG. 1. A description will now be given of a timing control of the data read operation with reference to FIGS. 1 and 2.

At the time of reading data, commands are sequentially applied to the SDRAM. More particularly, the SDRAM is supplied with a precharge command (PRE), a row address strobe signal /RAS (R), and a column address strobe signal /CAS (C). The precharge command is used to precharge a pair of bit lines BL and /BL to a predetermined potential. The row address strobe signal /RAS is used to select a memory cell block of the row system from a core circuit of the SDRAM, that is, to select a word line. The column address strobe signal /CAS is used to select a column, that is, the sense amplifier 220. The core circuit includes a plurality of memory cells 201 that are arrayed in the row and column directions. Each column is provided with the respective sense amplifier 220. Hence, the selected sense amplifier 220 senses data from the memory cell connected to the selected word line.

When the row address strobe signal /RAS is input to the SDRAM, a bit line transfer signal BLT0 is switched to the low level. At that time, a bit line transfer signal BLT1 is at the high level, and the NMOS transistors 203 and 204 are in the conducting states. Hence, the bit lines BL and /BL are connected to the sense amplifier 220. Simultaneously, a precharge signal PR is switched to the low level, and thus the bit lines BL and /BL are released from the reset state.

Then, a sub word line select signal SW is selected so that it is switched to the high level. Hence, the corresponding word line is selected, and the NMOS transistor 202 is caused to conduct. Hence, data stored in the capacitor 201 is read to the bit line BL.

Then, sense amplifier drive signals SA1 and SA2 are activated in order to drive the sense amplifier 220. Thus, the NMOS transistor 212 and the PMOS transistor 213 are turned ON. In that state, the data on the bit lines BL and /BL are read by the sense amplifier 220 via the NMOS transistors 203 and 204. Then, the sense amplifier 220 amplifies the data on the bit lines BL and /BL, and the amplitude between the bit lines BL and /BL is increased. At that time, data stored in the memory cells connected to the selected word line are read and amplified by the respective sense amplifiers 220.

Thereafter, a column line select signal CL switches to the high level in response to the column address strobe signal /CAS, and the corresponding column is selected. Then, the NMOS transistors 210 and 211 of the selected column gate are turned ON, and the amplified data on the bit lines BL and /BL are read to the data bus lines DB and /DB.

In order to successively read data related to the same row address (the same word line) in the single-bank configuration, different columns are sequentially selected by sequentially setting the column line select signals to the high level. Hence, the data already stored in the sense amplifiers and specified by the different column address values are sequentially read. When the burst length L is equal to 4, 4 consecutive bits of data can be read as shown in FIG. 2.

Thereafter, the precharge command is input. Hence, the precharge signal PR is switched to the high level at an appropriate timing. Hence, the NMOS transistors 207, 208 and 209 are turned ON, and the bit lines BL and /BL are set to a given potential VPR. Hence, the bit lines BL and /BL are reset, and are ready to the next control signal (R or W).

However, when the commands (R), (C) and (PRE) are input again in order to read data from a different row address (different word line), it is required to newly read data from the memory cells newly selected by the above commands and output the read data to the bit lines BL and /BL. In the single-bank configuration, it is required to precharge the bit lines BL and /BL in order to newly output data to the bit lines BL and /BL. Hence, a long blank period equal to 10 clocks occurs until the next data are read, as shown in FIG. 2.

In order to fill up the blank period, a bank interleaving method is employed in the SDRAM of the multi-bank configuration. In the bank interleaving method, command are applied so that a plurality of banks are sequentially selected and data are sequentially output from each selected bank at the respective timings. As shown in the lower part of FIG. 2, the commands are sequentially applied to banks 0 and 1. Hence, read data from the bank 1 can be output during the 10-clock blank period related to the bank 0.

There is an FCRAM, which is one of the semiconductor memories. A description will be given of the difference between the SDRAM and the FCRAM and a data read timing control of the FCRAM. The configuration of the peripheral circuits of the memory cells of the FCRAM is the same as that of the SDRAM.

In the first difference, the FCRAM is configured so that a plurality of columns are read at one time and data are read from the sense amplifiers 220 in parallel. Hence, it is sufficient to drive the sense amplifiers 220 during a fixed period. That is, the operation period of the sense amplifiers 220 can be set to a constant length regardless of the burst length BL. For instance, the operation periods of the amplifiers 220 with BL equal to 1 are the same as those with BL equal to 4. Hence, a reliable pipeline operation of the row system can be realized.

In the second difference, the FCRAM employs an internal precharge signal (which corresponds to the precharge signal (PRE) employed in the SDRAM). The internal precharge signal is used to automatically perform the reset operation.

The automatic reset operation utilizes the fact that the sense amplifiers operate during only the constant period. The precharge operation is carried out at an appropriate timing immediately after data are read from the sense amplifiers 220. Hence, it is possible to realize the data read operation in fast cycles close to the critical driving capability of the sense amplifiers 220.

In the third difference, the FCRAM has the read cycle in random access shorter than that of the SDRAM. This is because the FCRAM employs the pipeline operation and the self-precharge operation. For example, when the burst length BL is equal to 4 as in the case of the SDRAM, the 4-bit parallel data read from the sense amplifiers are converted into serial data. Hence, data can serially be read without any interruption.

FIG. 3 is a timing chart of the data read operation of the FCRAM having the memory peripheral circuits shown in FIG. 1. The data read timing control of the FCRAM will be described with reference to FIGS. 1 and 3. The burst length BL of read data is equal to 4 as in the case of the SDRAM shown in FIG. 2.

In response to an activation command (ACT), a signal RASZ is generated in the FCRAM. The signal RASZ instructs data of the memory cells 201 to be latched in the sense amplifiers 220. Further, in the FCRAM, generated are main and sub word line select signals MW and SW, the bit line transfer signal BLT, and the sense amplifier drive signals SA1 and SA2 at respective appropriate timings. Hence, data stored in the memory cells 201 appear on the bit lines BL, and are latched and amplified in the sense amplifiers 220.

Further, the internal precharge signal PRE is generated in the FCRAM when a given time elapses after the signal RASZ is received.

Furthermore, in response to the read command (RD), the column line select signals CL related to the column selected by the column address are switched to the high level, and data stored in the sense amplifier 220 are read out to the data bus lines DB and /DB. The data thus read are 4-bit parallel data, which are converted into serial data. Finally, the serial data is output to the outside of the FCRAM as read data DQ.

As shown in FIG. 3, the internal precharge signal PRE generated in the FCRAM resets the bit line transfer signal BLT and the word line select signals MW and SW, and precharges the bit lines BL and /BL to the given potential. The timing of the precharge operation responsive to the internal precharge signal PRE is placed immediately after the data are read from the sense amplifiers 220 in response to the column line select signals CL.

In the FCRAM, commands are received in a packet formation in order to reduce the intervals between the commands. As shown in FIG. 3, the activation command (ACT) and the read command (RD) are input as a single packet which extends over two cycles.

When the data read operation is repeatedly carried out, data can serially be read without any interruption with the burst length BL equal to four because the read cycle of the random access is comparatively short. That is, the FCRAM does not need the bank interleaving method employed in the SDRAM.

As described above, the FCRAM does not have the blank period which occurs in the SDRAM at the time of reading data, and can read data at a higher speed.

Theoretically, as the number of bits of data to be simultaneously read in parallel increases, the burst length increases. This requires that the potential differences between an increased number of pairs of bit lines connected to the selected word line are simultaneously amplified and the pairs of bit lines are simultaneously reset. This causes a delay in the read operation.

It is preferable that the core size be as small as possible in order to speed up the read operation. This, however, leads to a reduction in the number bits which can be simultaneously read in parallel. Nowadays, there is a requirement that a large number of bits of data can be simultaneously read at a higher speed. Such a tradeoff requirement cannot be satisfied at the present time.

SUMMARY OF THE INVENTION

It is a general object of the present invention to provide semiconductor integrated circuit memory in which the above disadvantages are eliminated.

A more specific object of the present invention is to provide a semiconductor integrated circuit memory in which a large number of bits of data can be simultaneously read at a higher speed.

The above objects of the present invention are achieved by a semiconductor memory comprising: memory cell blocks; a burst-length information generating circuit which generates burst-length information based on a burst length; and a block enable circuit which receives the burst-length information. The block enable circuit selectively enables one of the memory cell blocks when the burst length is equal to or shorter than a predetermined burst length and selectively enables a plurality of memory cell blocks based on the burst length when the burst length is longer than the predetermined burst length.

BRIEF DESCRIPTION OF THE DRAWINGS

Other objects, features and advantages of the present invention will become more apparent from the following detailed description when read in conjunction with the accompanying drawings, in which:

FIGS. 10A, 10B, 10C, 10D, 10E and 10F are respectively diagrams showing methods of setting the burst length in the semiconductor memory.

FIG. 12 is a table showing a status of each switch shown in FIG. 11 with respect to a case in which the burst length is 1, 2 or 4;

FIGS. 15A and 15B are tables showing operation conditions of four control-clock signals psclk0z–psclk3z and two output-control-clock signals outp0z and outp1z with respect to cases in which the burst length is 1, 2 and 4.

DESCRIPTION OF PREFERRED EMBODIMENTS

Figure 4:
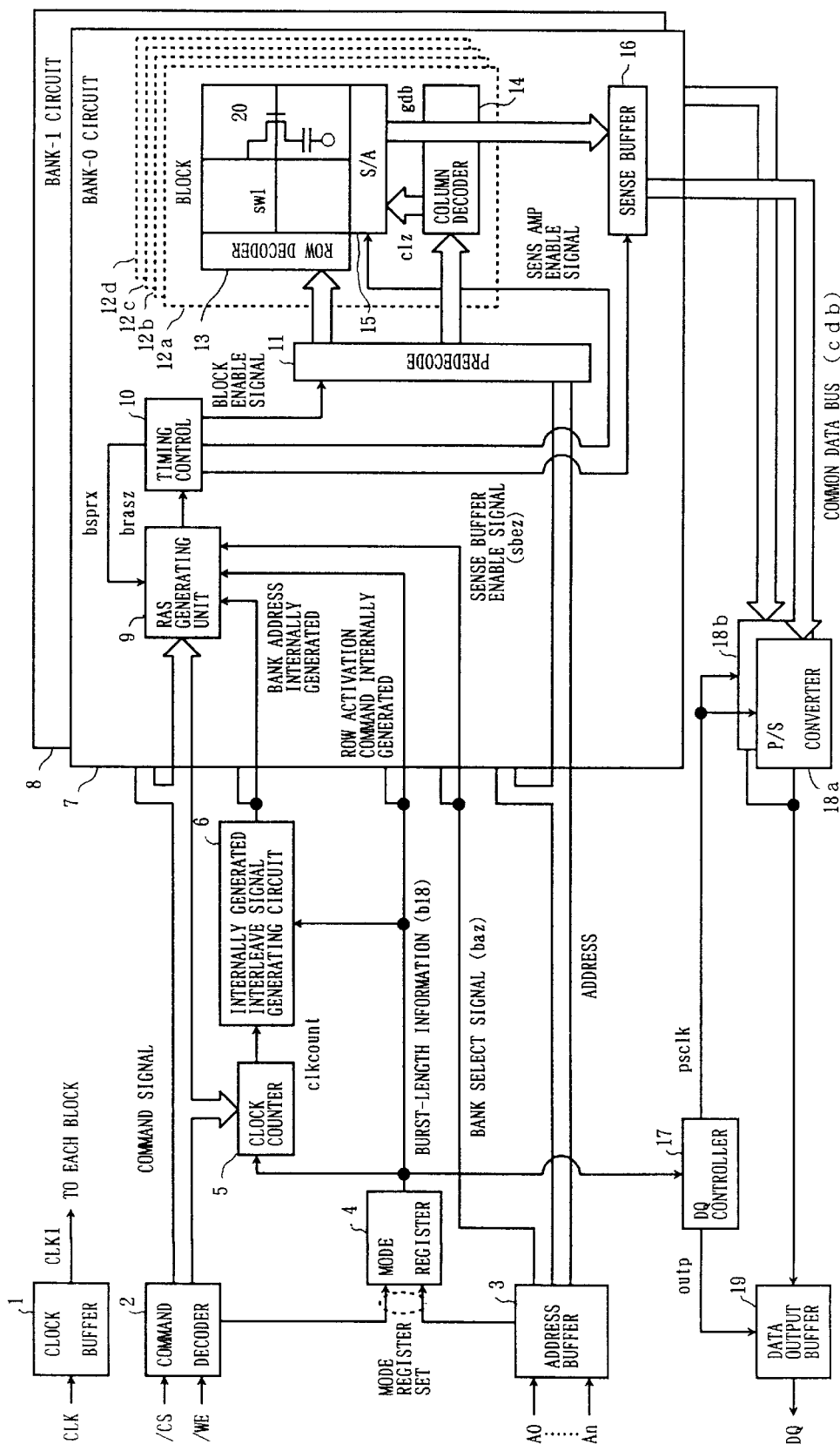
FIG. 4 is a block diagram of a semiconductor memory according to an embodiment of the present invention.

FIG. 4 is a semiconductor memory according to an embodiment of the present invention, and more particularly shows an FCRAM.

The FCRAM shown in FIG. 4 includes a clock buffer 1, a command decoder 2, an address buffer 3, a mode register 4, a clock counter 5, an internal interleave generating circuit 6, a bank-0 circuit 7, a bank-1 circuit 8, a DQ controller 17, a parallel-to-serial converter circuit 18a for the bank 0, a parallel-to-serial converter circuit 18b for the bank 1, and a data output buffer 19. Each of the circuits 7 and 8 includes a plurality of memory cell blocks 12a, 12b, 12c and 12d, a RAS generating unit 9, a timing controller 10, a predecoder 11, a row decoder 13, a column decoder 14, a sense amplifier block 15, and a sense buffer 16.

Figure 1:
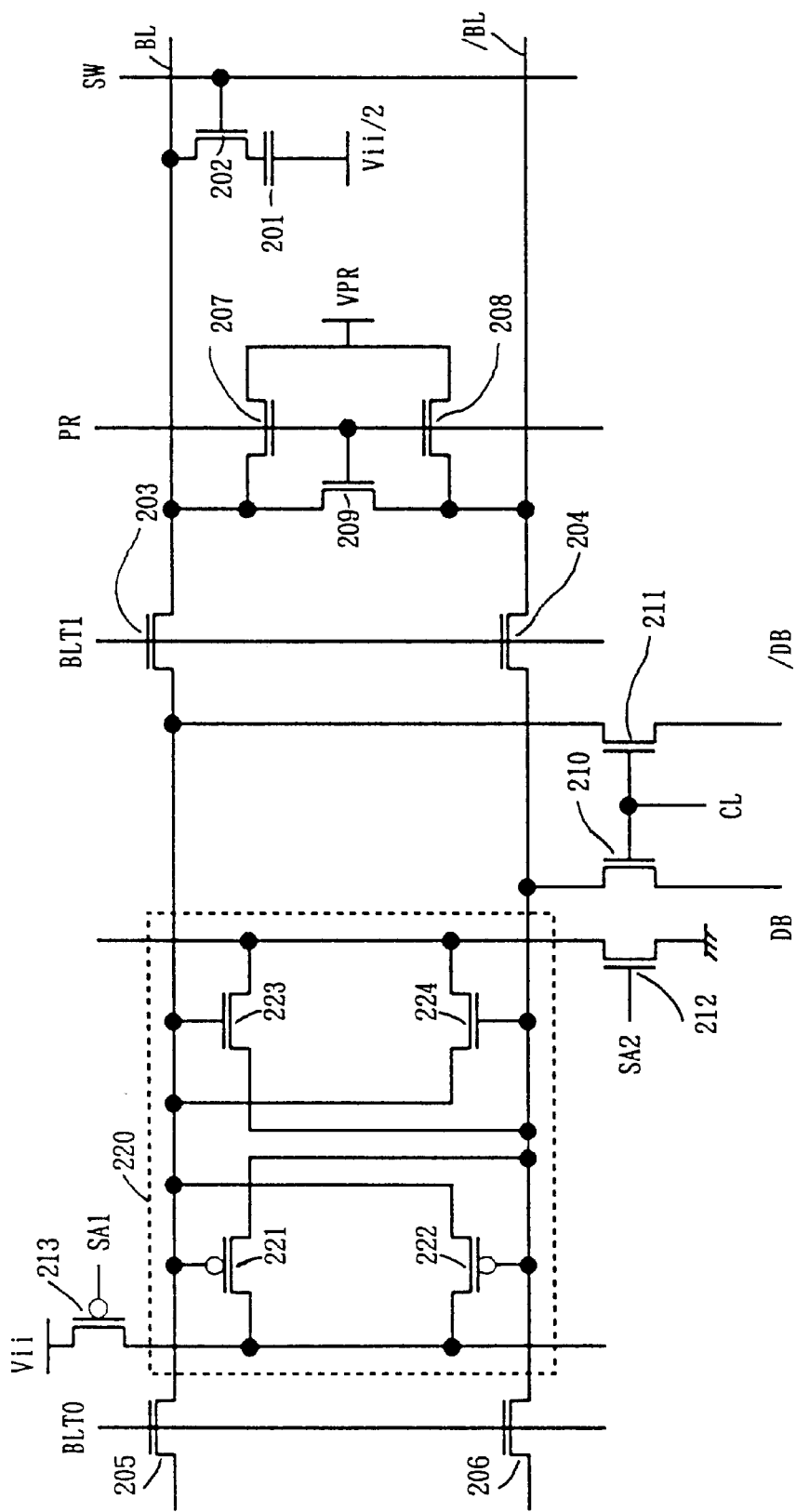
FIG. 1 is a circuit diagram of a peripheral circuit configuration of a memory cell of an SDRAM.
Figure 2:
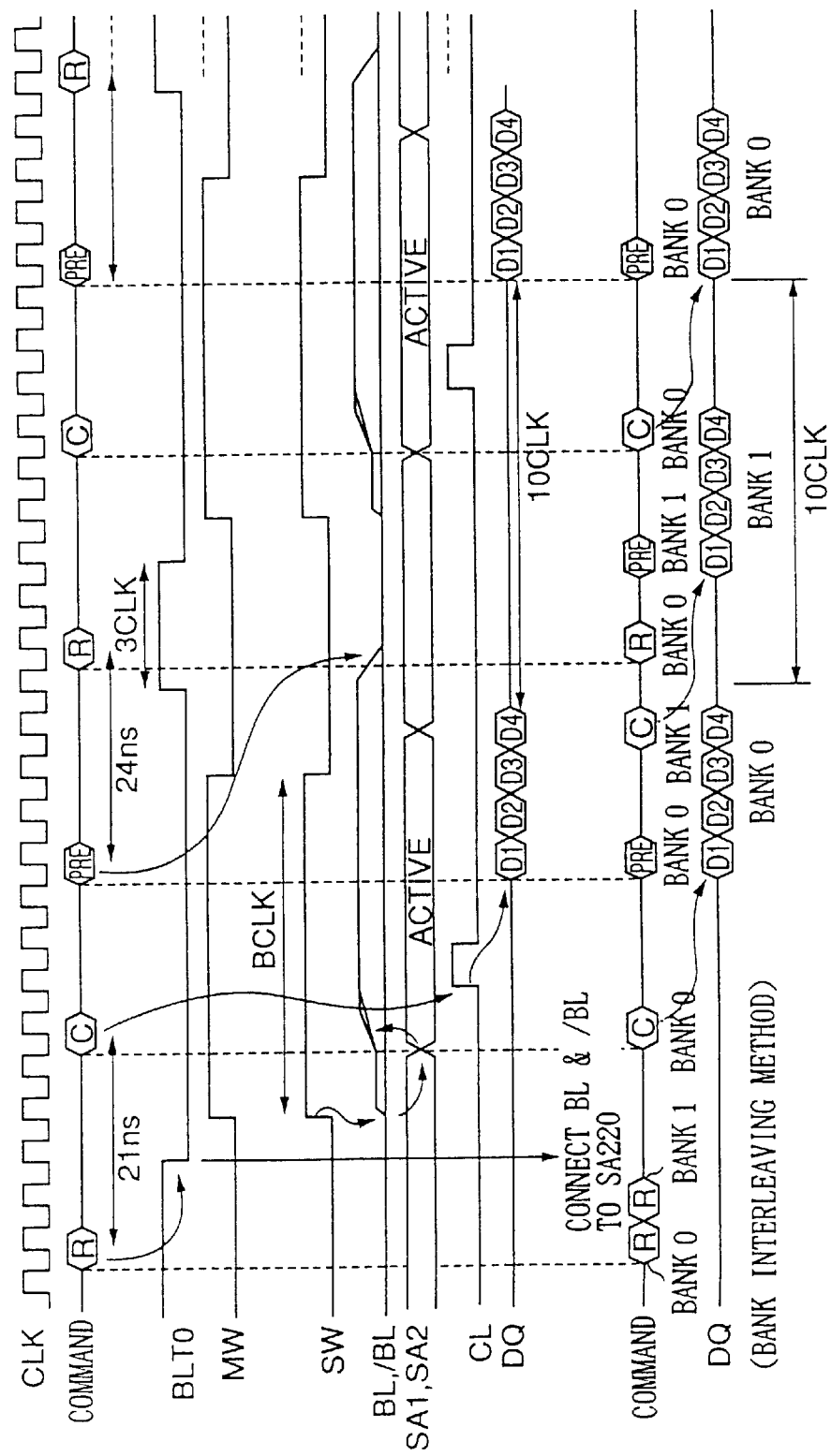
FIG. 2 is a timing chart of a conventional data read operation of the SDRAM.
Figure 3:
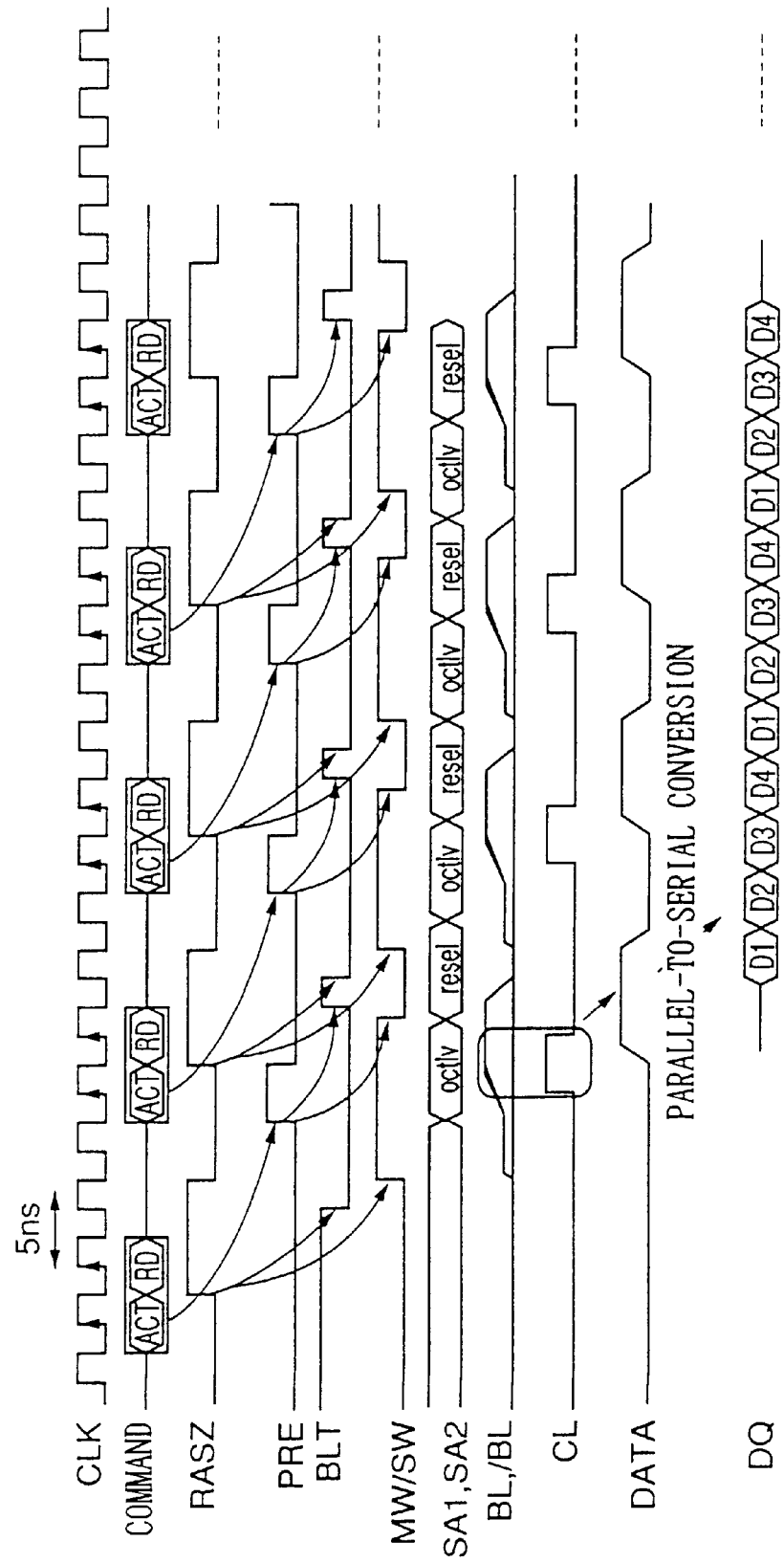
FIG. 3 is a timing chart of a data read operation of a conventional FCRAM.

In the FCRAM thus configured, the bank interleaving operation is automatically carried out. Thus, the memory cell blocks 12a–12d are selectively activated or enabled, and data stored in the selected memory cell block can be read at a high speed. Each of the memory cell blocks 12a–12d includes a plurality of memory cells 20 of the DRAM type cell structure having one capacitor and one transistor. The peripheral circuits of the memory cells 20 are configured as shown in FIG. 1. The memory cells 20 are arrayed in a matrix formation to form a core circuit (cell matrix), which is divided into parts on the bank basis. The divided cell matrixes form blocks 12a–12b in each of which blocks a plurality of memory cells 20 are arranged in the row and column directions.

The clock buffer 1 receives a clock signal CLK coming from the outside of the FCRAM. A synchronizing clock CLK 1 output from the clock buffer 1 is supplied to the parts forming the FCRAM. The command decoder 2 receives predetermined commands, such as a read command (WE: hereinafter the read command is assigned a symbol RD), a write command /WE, a chip select signal /CS, and notifies a decoded command to the bank-0 circuit 7 and the bank-1 circuit 8, which will be described in detail later. The symbol "/" denotes the negative logic. The address buffer 3 receives a memory address signal composed of address bits A0–An supplied from the outside of the FCRAM where n is an integer depending on the capacity of the FCRAM.

The mode register 4 is equipped with a register in which the burst length to be used is set. The burst length registered is supplied from the outside of the FCRAM, and is read from the register as burst-length information. The clock counter 5 generates a pulse signal at a periodical timing on the basis of the burst-length information. The internal interleave generating circuit 6 selects the bank to be activated on the basis of the burst-length information and the pulse signal generated by the clock counter 5. The parallel-to-serial converter circuits 18a and 18b convert parallel data read from the memory cell blocks 12a–12d of the bank-0 and bank-1 circuits 7 and 8 into serial data. The DQ controller 17 controls the parallel-to-serial converter circuits 18a and 18b and the data output buffer 19 at the time of reading data.

In the bank-0 circuit 7, the RAS generating unit 9 generates a signal brasz, which instructs data stored in the memory cells to be read by the sense amplifiers. The timing controller 10 generates a signal for activating the memory cell blocks 12a–12d, and an internal precharge signal bsprx which automatically precharges the activated blocks 12a–12d when a predetermined constant period elapses after the activation of the memory cell blocks 12a–12d is initiated. The predecoder 11 latches and predecodes the address signal supplied, and thus selects one of the blocks 12a–12d arranged in the associated bank. The row decoder 13 generates a word line select signal used to select the word line specified by the address signal. The sense amplifier block 15, which includes a plurality of sense amplifiers, receives and holds data read from the memory cells connected to the selected word line. The column decoder 14 generates a column line select signal for simultaneously selecting a plurality of bits of the data held in the sense amplifier block 15. The sense buffer 16 buffers the parallel data thus read. The bank-1 circuit 8 has the same configuration and function as those of the bank-0 circuit 7.

The FCRAM shown in FIG. 4 starts the data read operation when the predetermined signals such as the clock signal CLK, the activation command ACT, the control signal RD and the address signal composed of bits A0–An are input. First, a description will be given, with reference to FIG. 4, of the basic read operation of the FCRAM (for example, the read operation carried out when the burst length is equal to 4).

The internal clock signal CLK1 output from the clock buffer 1 is always supplied to the parts of the FCRAM in order to realize the synchronous operation. The activation command ACT and the control signal RD are decoded by the command decoder 2. The RAS generating unit 9 is controlled based on the decoding result. The address signal (A0–An) is supplied to the predecoder 11 via the address buffer 3, in which the address decoding is performed and a bank select signal baz is supplied to the RAS generating unit 9 of the bank in which the data read operation should be executed. It is now assumed that the bank select signal baz is supplied to the bank-0 circuit 7.

In response to the activation command ACT, the RAS generating unit 9 generates a signal brasz which is an internal row address strobe signal RAS. The RAS generating unit 9 is provided to successively generate the signal brasz in order to automatically perform the refresh operation when a refresh command is received. However, when the activation command ACT is received, the RAS generating unit 9 generates the signal brasz at one time. The signal brasz instructs data stored in the memory cells to be read by the sense amplifiers, and is supplied to the timing controller 10.

The timing controller 10 generates a block enable signal which activates one of the memory cell blocks 12a–12d of the bank-0 circuit 7, and supplies the above block enable signal to the predecoder 11. Simultaneously, the timing controller 10 generates a sense amplifier enable signal, which activates the sense amplifier block 15. Further, the timing controller 10 generates a buffer 16. The timing controller 10 generates a precharge signal bsprx when a predetermined constant time elapses after the signal brasz is received. The precharge signal bsprx generated in the FCRAM resets the RAS generating unit 9 and causes it to perform the precharge operation, as in the case where the precharge signal is supplied from the outside of the FCRAM. The precharge operation responsive to the precharge signal bsprx generated in the FCRAM will be referred to as a self-precharge operation.

The predecoder 11 receives the address signal (A0–An) and selects one of the memory cell blocks 12a–12d arranged in the bank-0 circuit 7, for example, the block 12a. When the predecoder 11 receives the block enable signal, the predecoder 11 controls the row decoder 13 to generate a word line select signal swl at an appropriate timing. In the bank-0 circuit, the row decoder 13 operates only in the selected memory cell block 12a. The data stored in all the memory cells within the block 12a connected to the selected word line are read and held by the sense amplifiers of the block 15.

Further, the predecoder 11 controls the column decoder 14 to generate a column line select signal clz at an appropriate timing. The column decoder 14 supplies the column line select signal clz to columns specified (the number of bits is fixed), for example, four columns. Thus, 4 bits are read from the sense amplifiers of the specified columns in parallel, and are supplied to the sense buffer 16. Then, the sense buffer 16 amplifies the 4-bit parallel data, and supplies the amplified data to the parallel-to-serial converter circuit 18a, which converts the received parallel data into serial data, which is output to the outside of the FCRAM via the data output buffer 19.

The RAS generating unit 9, an internal interleave generating circuit 6, a timing controller 10 and a predecoder 11 form a block enable circuit. Further, the clock counter 5 functions as a pulse generating circuit.

As described above, parallel data consisting of a plurality of bits can be read from the sense amplifier block 15 by selecting a plurality of columns at one time. Hence, it is sufficient to drive the sense amplifiers 15 during the fixed period. Thus, it is possible to set the sense amplifier operation period to be constant irrespective of the burst length BL and to realize the stable pipeline operation of the row system.

Further, in the FCRAM according to the embodiment of the present invention, the reset operation is automatically carried out by the internal precharge signal bsprx by utilizing the arrangement in which the sense amplifiers are simultaneously driven during the fixed period. The precharge operation is carried out at an appropriate timing immediately after the data are read from the sense amplifier block 15. Hence, it is possible to realize the data read operation in fast cycles close to the critical driving capability of the sense amplifiers 220.

Furthermore, the read cycle of the random access is comparatively short due to the pipeline operation and the self-precharge. Hence, when the burst length is equal to 4, the 4-bit parallel data read from the sense amplifiers are converted into serial data, so that data can be consecutively read and output without any interruption.

However, when the number of bits read from the sense amplifier block 15 in response to the column line select signal clz is 4, the maximum burst length is equal to 4. That is, only one of the banks can be selected in response to one read command. Hence, the available maximum burst length depends on the number of bits of parallel data read from the sense amplifier block 15.

According to the FCRAM according to the embodiment of the present invention, the bank interleaving operation is automatically performed within the FCRAM in addition to the above-mentioned basic data read operation. Hence, a plurality of memory cell blocks can selectively be activated.

Figure 5:
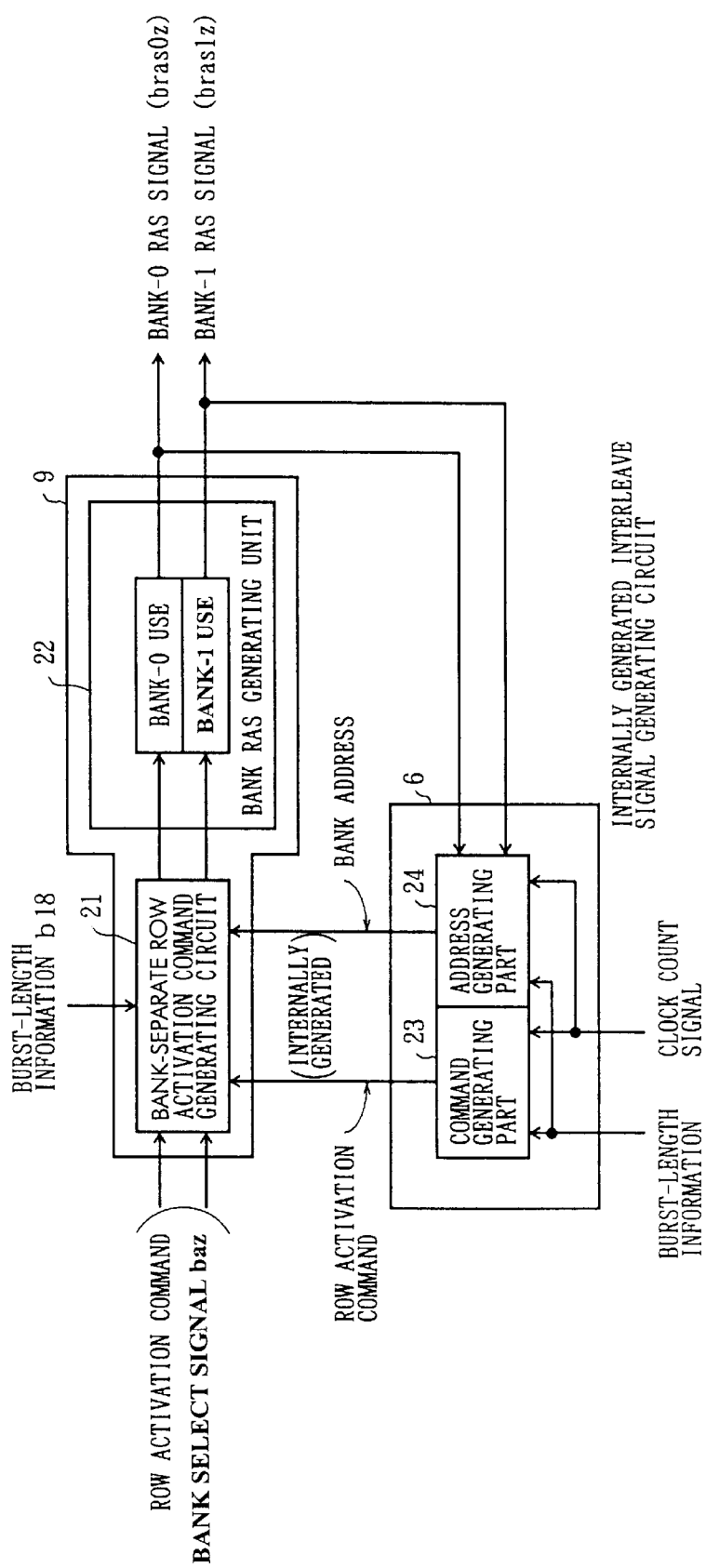
FIG. 5 is a block diagram illustrating a sequence of a RAS generating unit and an internal interleave generating circuit shown in FIG. 4.

FIG. 5 shows a sequence of selectively activating the bank-0 circuit 7 and the bank-1 circuit 8 shown in FIG. 4 by means of the RAS generating unit 9 and the internal interleaving generating circuit 6. A description will now be given, with reference to FIGS. 4 and 5, of the sequence of selectively activating the bank-0 circuit 7 and the bank-1 circuit 8 in the case where the burst length BL is equal to 8. Each of the banks 7 and 8 is provided with the respective RAS generating unit 9, and selects one of the memory cell blocks 12a–12d. Burst length information b18 indicating that the burst length BL is equal to 8 is applied to the RAS generating unit 9 from the mode register 4.

When the read command RD and the address signal composed of bits A0–An are input to the FCRAM, the internal interleave generating circuit 6 automatically performs the bank interleaving operation based on the burst length information b18. More particularly, the bank select signal baz from the address buffer 3 is invalidated, and a command generating part 23 of the internal interleave generating circuit 6 automatically generates a row activation command. Further, an address generating part 24 of the internal interleave generating circuit 6 generates a bank address, which specifies a bank to be subjected to the data read operation. The signals thus generated by the circuit 6 are then supplied to the RAS generating unit 9 in the bank-0 circuit 7, as shown in FIG. 5. Simultaneously, the clock counter 5 starts to count the clock in order to generate a pulse signal clkcount, which automatically activates another bank.

The RAS generating unit 9 of the bank-0 circuit 7 generates a signal bras0z, which is the row address strobe signal for the bank 0. The signal bras0z is a signal for instructing data in the memory cells to be read by the sense amplifier block 15, and is supplied to the timing controller 10.

As has been described previously, the timing controller 10 generates the block enable signal, which activates one of the blocks 12a–12d of the bank-0 circuit 7, and supplies it to the predecoder 11. Simultaneously, the timing controller 10 generates the sense amplifier enable signal, which activates the sense amplifier block 15. Thereafter, the timing controller 10 generates the sense buffer enable signal sbez. The signals thus generated by the timing controller 10 are supplied to the corresponding parts at respective timings. Further, the timing controller 10 generates the internal precharge signal bsprx, which automatically precharges the activated blocks 12a–12d when a predetermined constant period elapses after the activation of the memory cell blocks 12a–12d is initiated. The precharge signal bsprx generated within the FCRAM is used to reset the RAS generating unit 9 and causes it to perform the precharge operation, as in the case where the precharge signal is externally supplied.

The predecoder 11 receives the address signal (A0–An) and selects one of the memory cell blocks 12a–12d arranged in the bank-0 circuit 7, for example, the block 12a. When the predecoder 11 receives the block enable signal, the predecoder 11 controls the row decoder 13 to generate the word line select signal swl at an appropriate timing. In the bank-0 circuit, the row decoder 13 operates only in the selected memory cell block 12a. The data stored in all the memory cells within the block 12a connected to the selected word line are read and held by the sense amplifiers of the block 15.

Further, the predecoder 11 controls the column decoder 14 to generate the column line select signal clz at the appropriate timing. The column decoder 14 supplies the column line select signal clz to columns specified (the number of bits is fixed), for example, four columns. Thus, 4-bit parallel data gdb are read from the sense amplifiers of the specified columns, and are supplied to the sense buffer 16.

In the FCRAM according to the embodiment of the present invention, the bank (memory cell block) interleaving operation is automatically performed by the internal interleave generating circuit 6 in response to the pulse signal clkcount automatically generated by the clock counter 5. As described before, the row activation command is automatically generated by the command generating part 23 and the bank address which specifies the bank to be subjected to the data read operation is automatically generated by the address generating part 24. The signals thus generated are supplied to the RAS generating unit 9 of the bank-1 circuit 8.

The RAS generating unit 9 of the bank-1 circuit 8 generates a signal bras1z, which is the row address strobe signal for the bank 1. The signal bras1z is a signal which instructs data stored in the memory cells to be read by the sense amplifier block 15 and is supplied to the timing controller 10.

Then, the same operation as the above-mentioned operation of the bank-0 circuit 7 is carried out in the bank-1 circuit 8. The column line select signal clz is supplied to the four specified columns. Then, 4-bit parallel data gdb are read from the sense amplifiers of the sense amplifier block 15 located in the four specified columns, and are supplied to the sense buffer 16.

In the above state, the 4-bit parallel data in the sense buffers 16 of the banks 0 and 1 are amplified and are supplied to the parallel-to-serial converter circuits 18a and 18b, and are converted into respective serial data. Then, the serial data are serially arranged in the order of activation and are output to the outside of the FCRAM.

As described above, a plurality of memory cell blocks (banks) can be selectively activated in response to one read command. Hence, it is possible to select the memory cell blocks based on the burst length BL. When the burst length BL is equal to 8, two memory cell blocks (the memory cell block 12a of the bank-0 circuit 7 and the memory cell block 12a of the bank-1 circuit 8) are selectively activated and serial data are arranged in the order of activation and are output in response to one read command. When the burst length BL is equal to 32, eight memory cell blocks are selectively activated in response to one read command, as will be described later. Alternatively, two memory cell blocks can be sequentially activated.

In the FCRAM shown in FIG. 4, the transmission rate of the serial data in the parallel-to-serial converter circuits 18a and 18b is increased in accordance with the burst length BL set in the mode register 4.

For example, when the burst length BL is equal to 8, the clock signal CLK having a frequency twice the frequency used with the burst length BL equal to 4 is applied to the parallel-to-serial converter circuits 18a and 18b. Hence, the transmission rate used in the 8-bit burst length is twice the transmission rate in the 4-bit burst length. Thus, the cycle time necessary to perform the data read operation with the burst length BL equal to 8 is equal to that necessary to perform the data read operation with the burst length BL equal to 4. Hence, data can be read at a higher speed. As described above, the clock signal supplied to the parallel-to-serial converter circuits 18a and 18b when the burst length BL is equal to 8 is twice that with BL equal to 4. Alternatively, a conventional double data rate system may be employed in which the FCRAM operates in response to both the rising and falling edges of the clock signal CLK.

Figure 6:
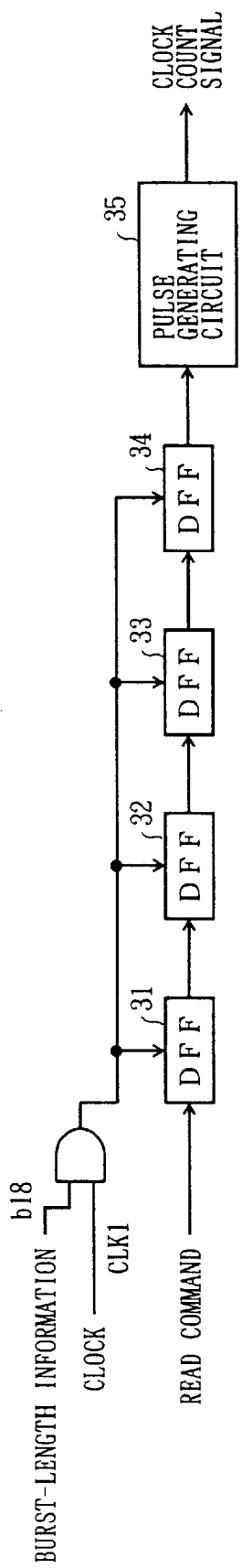
FIG. 6 is a block diagram of a clock counter shown in FIG. 4.

FIG. 6 is a circuit diagram of the clock counter 5 shown in FIG. 4. The clock counter 5 employs four stages of delayed flip-flops (DFF) 31, 32, 33 and 34, and periodically generates the pulse signal. When a plurality of memory cell blocks are activated, one memory cell block is activated four clocks later than the preceding activated memory cell block. Hence, data are output to the outside of the FCRAM in the order of activation. The number of cascaded flip-flops 31–34 is set equal to the number of parallel data simultaneously output to the sense buffer 16 by the column line select signal. For example, when 5-bit parallel data is read, five stages of delayed flip-flops are used.

When the burst-length information b18 is at a high level, the clock signal CLK1 is supplied to the flip-flops 31–34. The read command applied to the clock counter 5 is delayed by four clocks and are output to a pulse generating circuit 35, which generates the clock count signal clkcount in response to the rising edge of the delayed read command.

Figure 7:
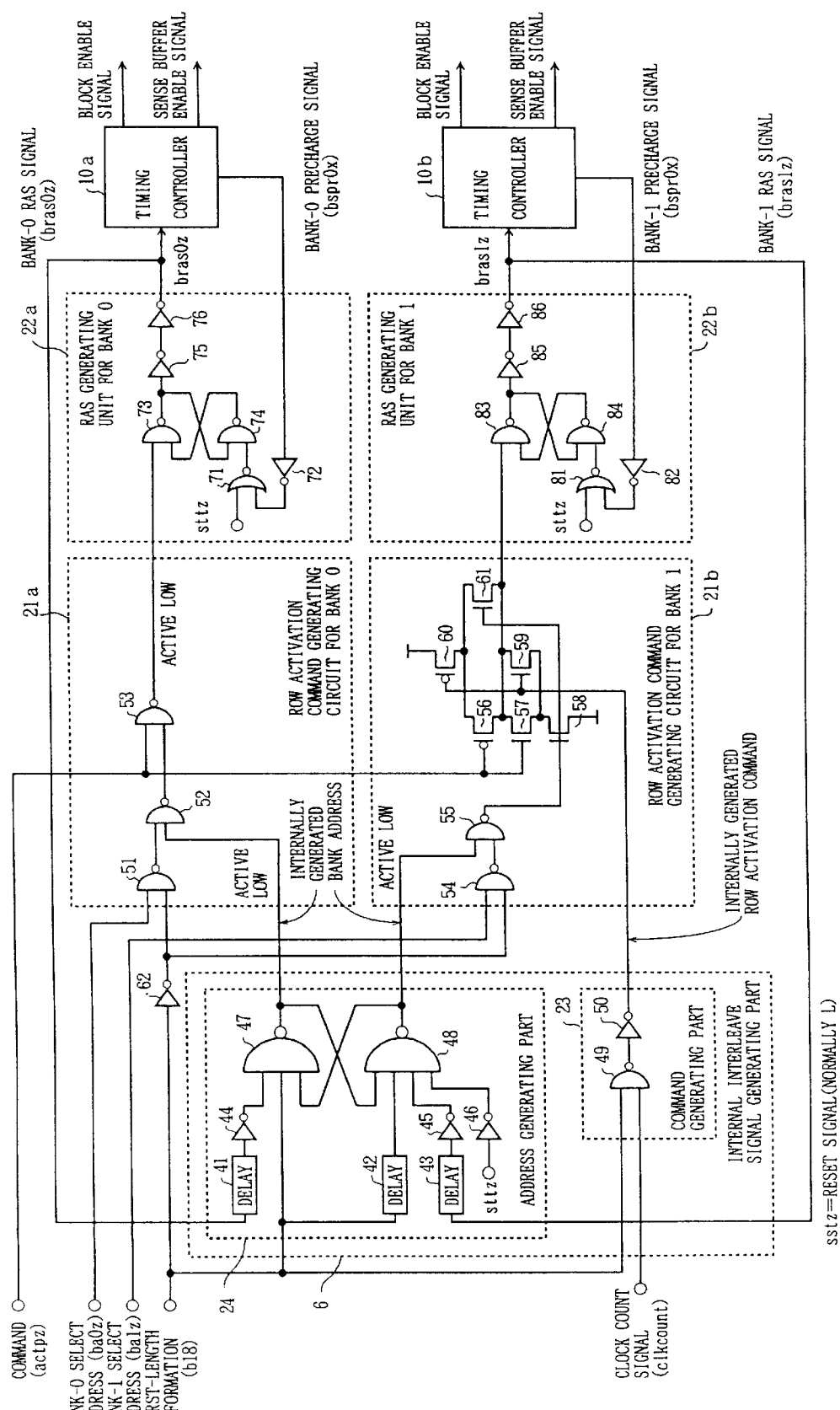
FIG. 7 is a circuit diagram of the RAS generating circuit and the internal interleave generating circuit shown in FIG. 4.

FIG. 7 is a circuit diagram of the internal interleave circuit 6 and the RAS generating unit 9 shown in FIG. 4.

The internal interleave circuit 6 includes the command generating part 23 made up of a NAND gate 48 and an inverter 49, and the address generating part 24 made up of delay circuits 41, 42 and 43, inverters 44, 45 and 46, and NAND gates 47 and 48. The command generating part 23 switches an internally generated row activation command to the high level in response to the rising edge of the clock count signal clkcount when the burst-length information b18 is at the high level, so that the following bank is controlled in the case where a plurality of banks are selected. The address generating part 24 includes an RS flip-flop. The two outputs of the RS flip-flop, which respectively serve as internally generated bank addresses, are both set to the high level when the burst-length information b18 is at the low level (BL=4). When the burst-length information b18 is at the high level (BL=8), the internally generated bank address for the bank 0 is set (low), and the other internally generated bank address for the bank 1 is reset (high). Hence, the bank-0 circuit 7 is selected. Thereafter, the internally generated bank address for the bank 0 is reset (high) in response to the rising edge of the signal bras0z for the bank 0, and the other internally generated bank address for the bank 1 is set (low). Hence, the bank-1 circuit 8 is selected. A reset signal sttz is normally low, and the RAS signals bras0z and bras1z for the banks 0 and 1 are both low at the initial state.

The RAS generating unit 9 in the bank-0 circuit 7 includes a row activation command generating circuit 21a for the bank 0, a RAS generating unit 22a for the bank 0, and a timing controller 10a for the bank 0. The row activation command generating circuit 21a is made up of NAND gates 51, 52 and 53. The RAS generating unit 22a is made up of a NOR gate 71, inverters 72, 75 and 76, and NAND gates 73 and 74. The row activation command generating circuit 21*a* enables the high level of a bank-0 selecting address ba0z output from the address buffer 3 when the burst-length information b18 received via the inverter 62 is low (BL=4) and the activation command actpz is high. Hence, the row activation command of the low level for the bank 0 is selected. When the burst-length information b18 is high (BL=8), the circuit 21*a* disables the bank-0 select address ba0z, and outputs the row activation command for the bank 0 in response to the rising edge of the activation command actz. The row activation command for the bank 0 is low when the internally generated bank address is an address which selects the bank 0. The RAS generating unit 22*a* for the bank 0 switches the RAS signal bras0z for the bank 0 to the high level from the low level upon receiving the low-level signal from the row activation command generating circuit 21*a*.

The RAS generating unit 9 for the bank-1 circuit 8 includes a row activation command generating circuit 21*b*, a RAS generating unit 22*b* for the bank 1, and a timing controller 10*b* for the bank 1. The row activation command generating circuit 21*b* is made up of NAND gates 54, 55 and transistors 56, 57, 58, 59 and 60. The RAS generating unit 22*b* is made up of a NOR gate 81, inverters 82, 85 and 86, and NAND gates 83 and 84. The row activation command generating circuit 21*b* for the bank 1 enables the high level of a bank-1 selecting address ba1z output from the address buffer 3 when the burst-length information b18 received via the inverter 62 is low (BL=4) and the activation command actpz is high. Hence, the row activation command of the low level for the bank 1 is selected. When the burst-length information b18 is high (BL=8) and the count signal clk-count is high, the circuit 21*b* disables the bank-1 select address ba1z, and outputs the row activation command for the bank 1 in response to the rising edge of the activation command actz. The row activation command for the bank 1 is low when the internally generated bank address is an address which selects the bank 1. The RAS generating unit 22*b* for the bank 1 switches the RAS signal bras1z for the bank 1 to the high level from the low level upon receiving the low-level signal from the row activation command generating circuit 21*b* for the bank 1 and the high level of the internally generated row activation command.

Figure 8:
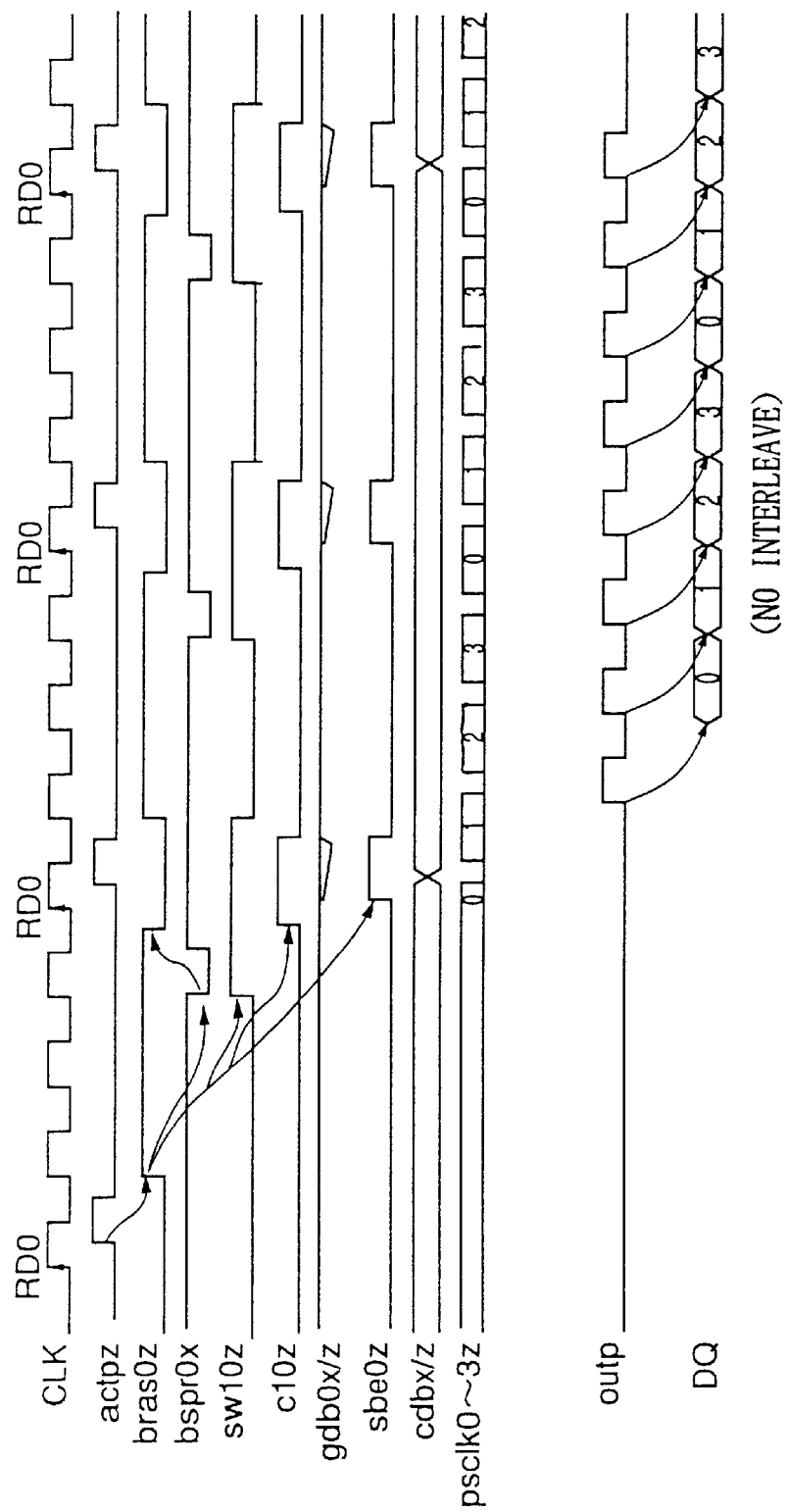
FIG. 8 is a timing chart of a data read operation of the memory shown in FIG. 4 performed when the burst length is equal to 4.

FIG. 8 is a timing chart of a data read operation of the FCRAM according to the embodiment the present invention performed when the burst length BL is equal to 4. The timing chart of FIG. 8 will be described in detail by referring to FIGS. 6 and 7. The burst-length information indicating the burst length BL is equal to 4 is registered in the mode register 4 beforehand, and the burst-length information b18 is at the low level.

The clock signal CLK has a cycle of, for example, 5 ns. When the activation command ACT, the read command RD0 for the bank 0, and the address signal composed of A0–An are input, the command actpz is switched to the high level. Then, the RAS generating unit 22*a* for the bank 0 receives the low-level signal from the row activation command generating circuit 21*a* for the bank 0, and switches the RAS signal bras0z for the bank 0 to the high level from the low level. In this case, the burst-length information b18 is set to the low level beforehand, and the high level of the bank-0 select address ba0z (the output from the address buffer 3) is enabled.

The signal bras0z is supplied to the timing controller 10*a*, which generates the block enable signal for activating any of the blocks 12*a*–12*d* in the bank-0 circuit 7 in response to the low-to-high change of the signal bras0z. The block enable signal is supplied to the predecoder 11. The timing controller 10*a* generates the precharge signal bspr0x after the predetermined constant period elapses. The precharge signal bspr0x resets the RAS generating unit 9 in the bank-0 circuit 7 as in the case where the precharge signal is externally supplied.

The predecoder 11 receives the address signal composed of A0–An, and thus selects one of the memory cell blocks arranged in the bank-0 circuit 7. Further, the predecoder 11 receives the block enable signal and thus controls the row decoder 13 to change the word line select signal swl0z from the low level to the high level at an appropriate timing. The row decoder 13 of only the selected memory cell block operates in the bank-0 circuit 7. Hence, data stored in the memory cells connected to the word line selected by the word line select signal swl0z are read and latched by the corresponding sense amplifiers of the sense amplifier block 15.

Further, the predecoder 11 controls the column decoder 14 to change the column line select signal cl0z from the low level to the high level at an appropriate timing. The column decoder 14 supplies the column line select signal cl0z to the four specified columns. Thus, 4-bit parallel data gdb0x/z are read by the sense amplifiers of the selected columns and are then supplied to the sense buffer 16.

In the above state, the timing controller 10*a* changes the sense buffer enable signal sbe0z for activating the sense buffer 16 from the low level to the high level, so that the sense buffer 16 is activated. The sense buffer 16 amplifies the 4-bit parallel data to thus generate parallel data cdbx/z, which is then supplied to the parallel-to-serial converter circuit 18*a*.

The 4-bit parallel data cdbx/z are converted into serial data by the parallel-to-serial converter circuit 18*a* in synchronism with clock signals psclk0z–psclk3z from the DQ controller 17. Then, the serial data is supplied to the data output buffer 19, which outputs the received serial data in synchronism with a control signal outp from the DQ controller 17.

As shown in FIG. 8, the read command R0 is input every 20 ns. When the burst length BL is equal to 4, serial data are successively read from the memory cell blocks which are selected one by one each time the read command R0 is input.

Figure 9:
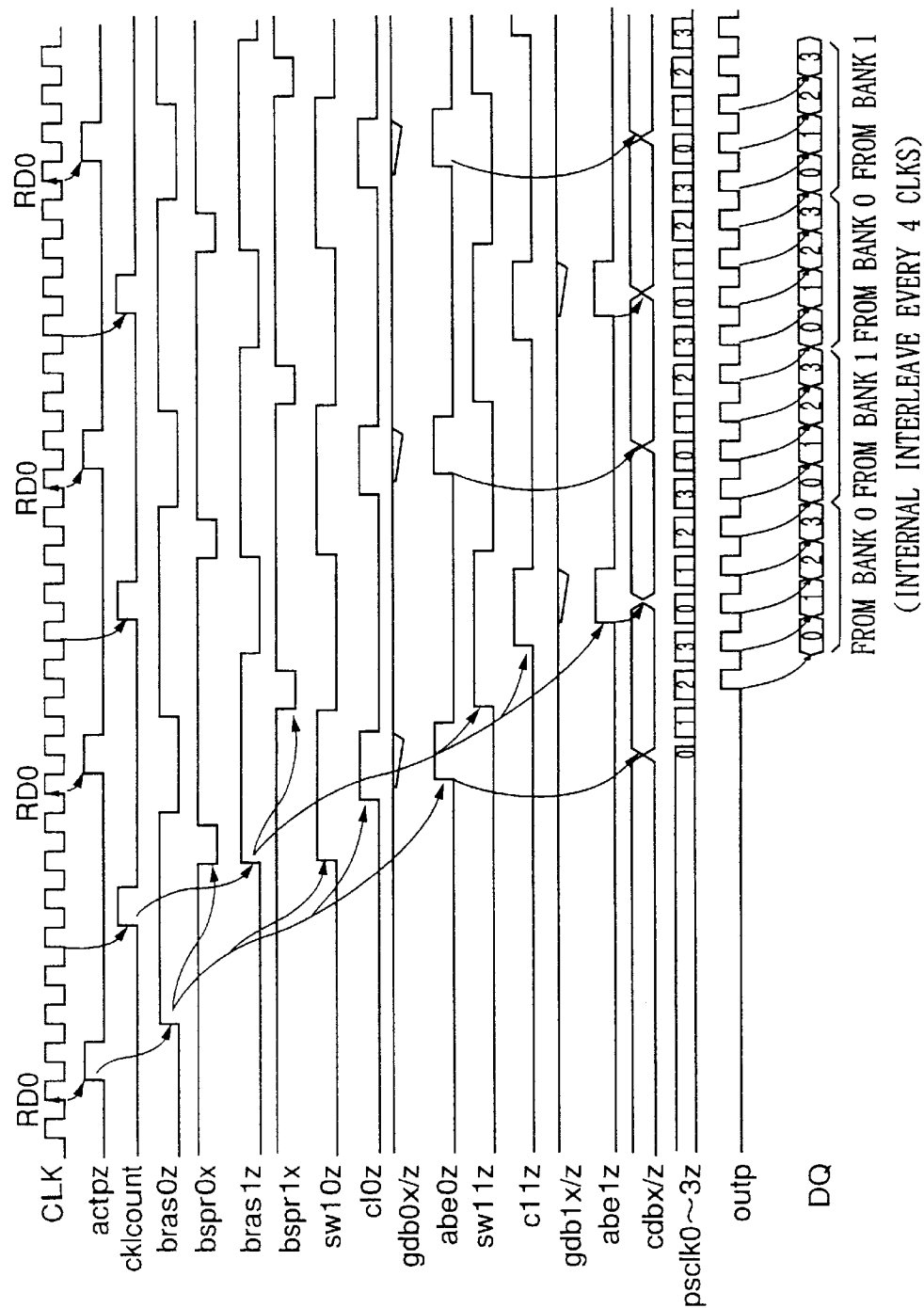
FIG. 9 is a timing chart of a data read operation of the memory shown in FIG. 4 performed when the burst length is equal to 8.

FIG. 9 is a timing chart of a data read operation of the FCRAM performed when the burst length BL is equal to 8. The timing chart of FIG. 9 will be described in detail by referring to FIGS. 6 and 7. The burst-length information indicating the burst length BL is equal to 8 is registered in the mode register 4 beforehand, and the burst-length information b18 is at the high level.

The clock signal CLK has a cycle of, for example, 2.5 ns. When the activation command ACT, the read command RD0 for the bank 0, and the address signal composed of A0–An are input, the command actpz is switched to the high level. Then, the RAS generating unit 22*a* for the bank 0 receives the low-level signal from the row activation command generating circuit 21*a* for the bank 0, and switches the RAS signal bras0z for the bank 0 to the high level from the low level. In this case, the burst-length information b18 is set to the high level beforehand, and the high level of the bank-0 select address ba0z (the output from the address buffer 3) is disabled, while the internally generated bank address from the internal interleave 6 is enabled.

In response to the high level of the command actpz, the clock counter 5 starts to count the clock signal.

The signal bras0z is changed to the high level and is supplied to the timing controller 10*a*. In response to the low-to-high level change of the signal bras0z, the timing controller 10a generates the block enable signal which activates any of the memory cell blocks 12a–12d in the bank-0 circuit 7, and supplies it to the predecoder 11. Further, the timing controller 10a generates the precharge signal bspr0z after the given time. The precharge signal brproz internally generated resets the RAS generating unit 9 in the bank-0 circuit 7 for precharging as in the case where the precharge signal is supplied from the outside of the FCRAM.

The predecoder 11 selects one of the memory cell blocks arranged in the bank-0 circuit 7 upon receiving the address signal composed of A0–An, and controls, upon receiving the block enable signal, the row decoder 13 to change the word line select signal swl0z from the low level to the high level at an appropriate timing. In the bank-0 circuit, the row decoder 13 of only the selected memory cell block operates. Thus, the data stored in all the memory cells connected to the word line selected by the word line select signal swl0z are sensed by and stored in the sense amplifier block 15.

Further, the predecoder 11 controls the column decoder 14 to change the column line select signal cl0z from the low level to the high level at an appropriate timing. The column decoder 14 supplies the column line select signal cl0z to the four specified columns. Hence, 4-bit parallel data gdb0x/z are read from the sense amplifiers of the block 15 located in the selected columns, and are supplied to the sense buffer 16.

In the above state, the timing controller 10a changes the sense buffer enable signal sbe0z for enabling the sense buffer 16 from the low level to the high level, so that the sense buffer 16 is activated. The sense buffer 16 thus activated amplifies the 4-bit parallel data supplied thereto, and derives parallel data cdbx/z therefrom. Then, the parallel data cdbx/z is supplied to the parallel-to-serial converter circuit 18a.

The 4-bit parallel data cdbx/z is converted into serial data by the parallel-to-serial converter circuit 18a in synchronism with the clock signals psclk0z–psclk3z from the DQ controller 17. Then, the serial data is supplied to the data output buffer 19, and is output, as output data DQ, to the outside of the FCRAM in synchronism with the control signal outp from the DQ controller 17.

When data is being read from on the bank-0 circuit 7 is in progress, the data read operation on the bank-1 circuit 8 is in progress in the pipeline formation.

The clock count signal clkcount that is output from the clock counter 5 which started the count operation ahead is changed to the high level (pulse) in synchronism with the rising edge of the fourth clock obtained after the command actpz is changed from the low level to the high level.

In response to the low-to-high level change of the clock count signal clkcount, the internal interleave signal generating circuit 6 changes the internally generated row activation command from the low level to the high level. Further, the row activation command generating circuit 21b for the bank 1 changes its output to the low level upon receiving the high-level signal of the internally generated row activation command.

The RAS generating unit 22b for the bank 1 changes the RAS signal bras1z for the bank 1 from the low level to the high level. The signal bras1z is supplied to the timing controller 10b, which generates the block enable signal for activating any of the blocks 12a–12d in the bank-1 circuit 8 in response to the low-to-high level change of the signal bras1z. The block enable signal is then supplied to the predecoder 11. Further, the timing controller 11b generates the precharge signal bspr1x after the given time. The precharge signal bspr1x internally generated resets the RAS generating unit 9 of the bank-1 circuit 8 and causes it to perform the precharge operation.

Upon receiving the address signal composed of A0–An, the predecoder 11 selects one of the memory cell blocks 12a–12d arranged in the bank-1 circuit 8. Further, the predecoder 11 controls the row decoder 13 to change the word line select signal swl1z at an appropriate timing in response to receipt of the block enable signal. In the bank-1 circuit 8, the row decoder 13 of only the selected memory cell block operates. Thus, the data stored in all the memory cells connected to the word line selected by the word line select signal swl1z are read by and held in the sense amplifier block 15.

Further, the predecoder 11 controls the column decoder 14 to change the column line select signal cl1z from the low level to the high level at an appropriate timing. The column decoder 11 supplies the column line select signal cl1z to the four specified columns. Hence, 4-bit parallel data gdb1x/z are read from the corresponding sense amplifiers of the block 15 and are supplied to the sense buffer 16.

In the above state, the timing controller 10b changes the sense buffer enable signal sbe1z for enabling the sense buffer 16 from the low level to the high level, so that the sense buffer 16 is enabled. The sense buffer 16 amplifies the 4-bit parallel data received and derives parallel data cdbx/z therefrom. Then, the parallel data cdbx/z is supplied to the parallel-to-serial converter circuit 18a.

The 4-bit parallel data cdbx/z is converted into serial data by the parallel-to-serial converter circuit 18a in synchronism with the clock signals psclk0z–psclk3z from the DQ controller 17.

The serial data thus converted is supplied to the data output buffer 19, from which the received serial data is output as the output data DQ in synchronism with the control signal outp from the DQ con.

As shown in FIG. 9, when the read command R0 and the burst length BL is equal to 8 in the FCRAM that performs the above-mentioned data read operation, the memory cell block selected by the rising edge of the command acpz and the memory cell block selected by the rising edge of the clock count signal clkcount are operated in the pipeline formation with a difference equal to 4 clocks, and serial data can successively be read from the memory cell blocks. When the burst length BL is equal to 8, the clock signal CLK is input in a cycle of 2.5 ns.

Hence, the data transmission rate is twice that obtained with the burst length BL equal to 4.

FIGS. 10A through 10F show methods for setting the burst length BL other than the mode register 4.

FIG. 10A shows a method which uses a circuit such as an inverter, which is connected to a 30 power supply VCC via a fuse. The input of the circuit is coupled to another power supply VSS such as ground via a high resistor. The output of the circuit forms the burst length information b18. The burst length BL is set during the fabrication process. More particularly, as shown in FIG. 10D, when the burst length BL should be set equal to 4, the fuse is not cut. In contrast, when the burst length BL should be set equal to 8, the fuse is cut. Hence, the FCRAM with the burst length BL fixed to 4 or 8 can be obtained. It is possible to set an increased number of lengths equal to, for example, 4, 8, 16 and 32. In this case, the same circuits as shown in FIG. 10A are provided to the respective burst lengths. During the fabrication process, the fuse related to the burst length to be selected is maintained, while the other fuses are cut.

FIG. 10B shows a method which employs a circuit such as an inverter associated with a VCC pad and a VSS pad. As shown in FIG. 10E, when the burst length BL is set equal to 4, the input terminal of the inverter is connected to the VCC pad by wire bonding a. When the burst length is set equal to 8, the input terminal of the inverter is connected to the VSS pad by bonding wire b. Hence, the FCRAM with the burst length fixed to 4 or 8 can be obtained. It is possible to set an increased number of lengths equal to, for example, 4, 8, 16 and 32. In this case, inverters or the like are provided to the respective burst lengths. During the fabrication process, the wire bonding related to the burst length to be selected is provided.

FIG. 10C shows a method which uses a circuit such as an inverter and two switches a and b. As shown in FIG. 10F, when the burst length BL is set equal to 4, the switch a is closed while the switch b is open. When the burst length BL is set equal to 8, the switch b is closed while the switch a is open. Hence, the FCRAM with the burst length fixed to 4 or 8 can be obtained. It is possible to set an increased number of lengths equal to, for example, 4, 8, 16 and 32. In this case, a plurality of circuits as shown in FIG. 10C are provided to the burst lengths. During the fabrication process, only the switch related to the burst length to be selected is closed.

Figure 11:
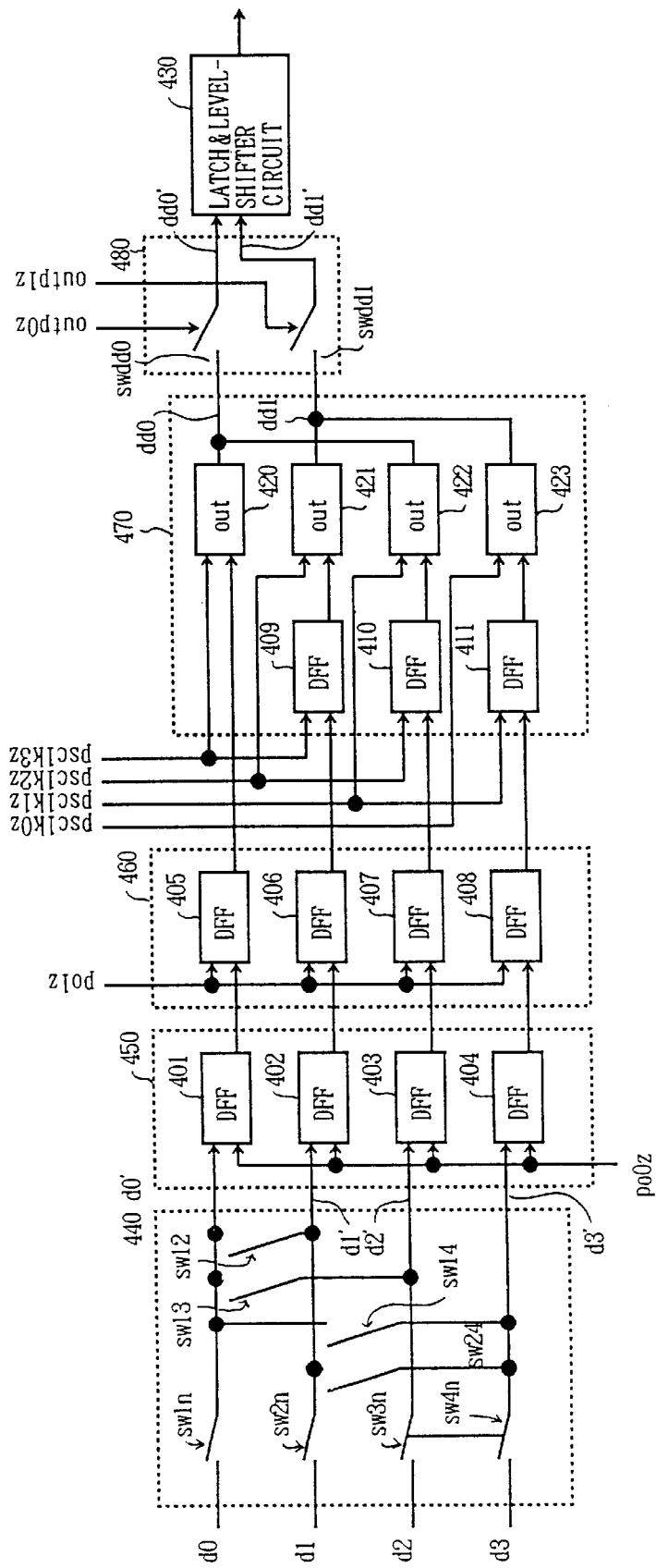
FIG. 11 is a block diagram of a parallel-to-serial converter circuit shown in FIG. 4.

FIG. 11 is a block diagram of each of the parallel-to-serial converter circuits 18a and 18b shown in FIG. 4. The converter circuit shown in FIG. 11 includes a data-bus switch 440, a first register 450, a second register 460, a 4-bit-to-2-bit conversion circuit 470, a latch&level-shifter circuit 430, and a data-output-timing switch 480. The data-bus switch 440 receives a 4-bit parallel data from the sense buffer 16, and changes path connections between the input bus lines and the output bus lines based on the burst-length information and some of the column-address information. The first register 450 and the second register 460 are provided in this order on the output side of the data-bus switch 440. The 4-bit-to-2-bit-conversion circuit 470 converts 4-bit parallel data to 2-bit parallel data when the 4-bit parallel data is output from the second register 460. On the output side of the 4-bit-to-2-bit-conversion circuit 470, the data-output-timing switch 480 is provided, and converts the 2-bit parallel data into one-bit serial data. The latch&level-shifter circuit 430 is provided after the data-output-timing switch 480.

In what follows, a detailed configuration and operations will be described with respect to each element.

The data-bus switch 440 includes switches sw1n, sw2n, and sw3n corresponding to four data-bus lines d0, d1, d2 and d3, a switch sw 24 for connecting between the data-bus lines d1 and d3, a switch sw14 for connecting between the data-bus lines d0 and d3, a switch sw13 for connecting between the data-bus lines d0 and d2, and a switch sw12 for connecting between the data-bus lines d0 and d1. These switches are controlled in terms of on/off conditions thereof in accordance with the burst-length information BL and column-address signals caa0z and caa1z.

FIG. 12 is a table showing a status of each switch with respect to a case in which the burst length BL is 1, 2 or 4. When the burst length BL is 4, the data on the data-bus lines d0 through d3 is transferred to the data-bus lines d0' through d3' without any change. Namely, the switches sw1n, sw2n and sw3n are switched ON (closed), and the switches sw24, sw14, sw13 and sw12 are switched OFF (open) regardless of statuses of the column-address signals caa0z and caa1z.

When the burst length BL is 2, data on the data-bus lines d0' and d1' are output to outside according to the design specification of this configuration. In this case, therefore, a choice is whether to transfer data from the data-bus lines d0 and d1 to the data-bus lines d0' and d1' or from the data-bus lines d2 and d3 to the data-bus lines d0' and d1'. This choice is made by a logic value of the column-address signal caa0z. When the column-address signal caa0z is set to a low (L) level, a data set of data-bus lines d0 and 1 is conveyed to the data-bus lines d01 and d1'. In this case, the switches sw1n, sw2n, and sw3n are switched ON (closed), and the switches sw24, sw14, sw13 and sw12 are switched OFF (open). When the column-address signal caa0z is set to the high (H) level, a data set of the data-bus lines d2 and d3 is conveyed to the data-bus lines d0' and d1'. In this case, the switches sw3n, sw24 and sw13 are switched ON (closed), and the switches sw1n, sw2n, sw14 and sw12 are switched OFF (open). Namely, data on the data-bus line d2 is conveyed to the data-bus line d0' via the switch sw13, and data on the data-bus line d3 is conveyed to the data-bus line d1' via the switch sw24. When the burst length BL is 2, a logic value of the other column-address signal caa1z is not relevant to selection of the switches.

When the burst length BL is 1, one bit is selected from the data on the data-bus lines d0, d1, d2 and d3, and is transferred to the data-bus line d0' to be output to outside. The selection of data is made according to a combination of the column-address signals caa0z and caa1z. In order to select the data of the data-bus line d0, both caa0z and caa1z are set to the low level. In this case, switches sw1n, sw2n, and sw3n are switched ON (closed), and the switches sw24, sw14, sw13 and sw12 are switched OFF (open). The data of the data-bus line d0 is thus passed along to the data-bus line d0'. When the data of the data-bus line d1 needs to be selected, caa0z is set to the high level, and caa1z is set to the low level. This closes the switches sw2n, sw3n and sw12, and opens the switches sw1n, sw24 and sw13. In this case, the data of the data-bus line d1 is transferred to the data-bus line d0'. When the data-bus line d2 or d3 is to be selected, similarly, an ON/Off status of each switch is determined based on the logic table of FIG. 32.

The parallel data d0'–d3' output from the data-bus switch 440 is first supplied to the first register 450, and is then supplied to the second register 460.

The first register 450 includes four delayed flip-flops (DFF) 401–404. Each DFF has a data-acquisition timing and a latch timing thereof controlled by a first control signal po0z. The second register 460 includes four delayed flip-flops (DFF) 405–408. Each DFF has a data-acquisition timing and a latch timing thereof controlled by a second control signal po1z.

Figure 13:
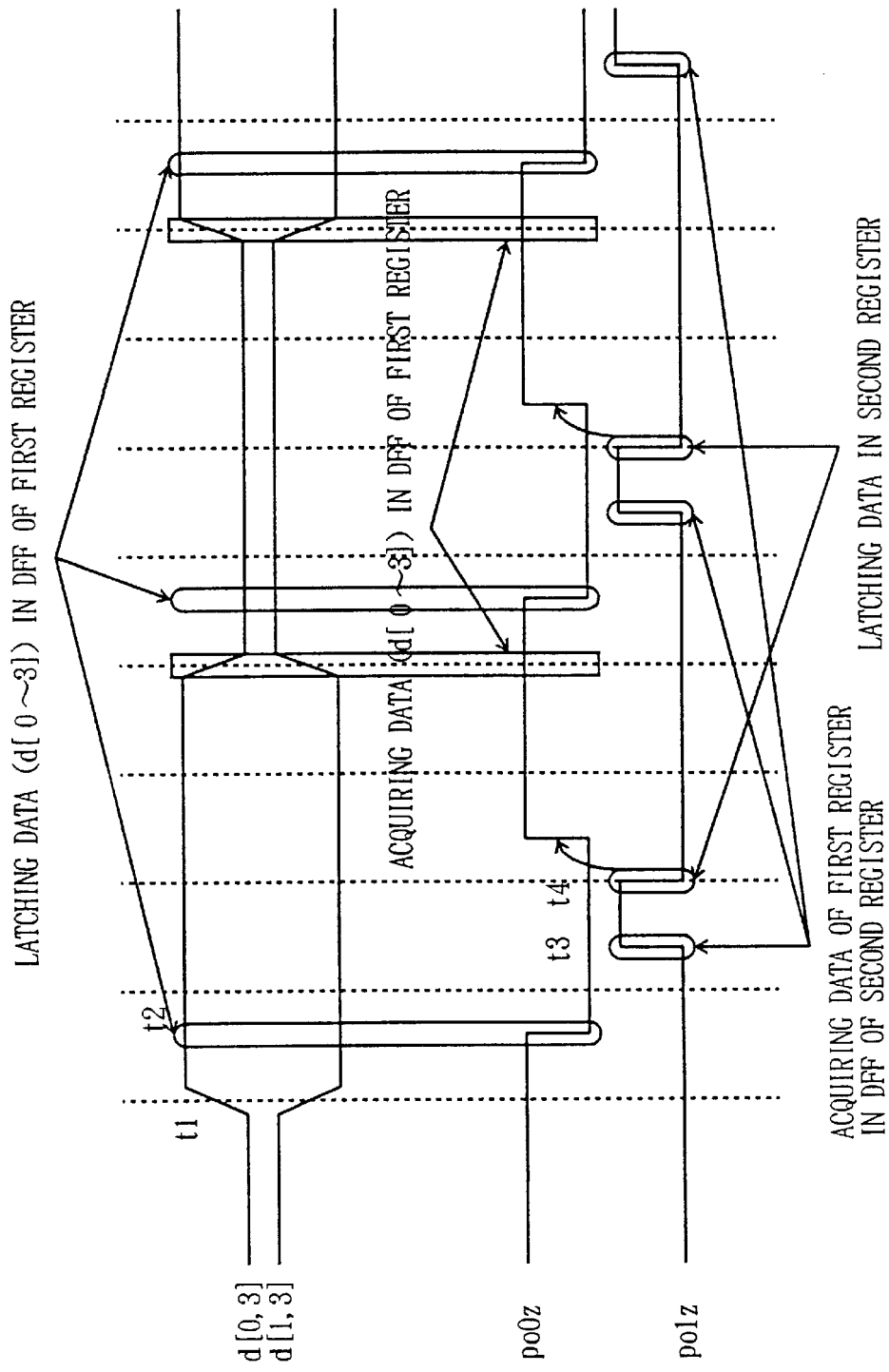
FIG. 13 is a timing chart showing operations of first and second registers shown in FIG. 11.

FIG. 13 is a timing chart showing operations of the first and second registers 450 and 460. In the FIG., d[0,2] represents data on the data-bus lines d0' and d2', and d[1,3] represents data on the data-bus lines d1' and d3'.

At a time t1 in FIG. 13, parallel data appears on the data-bus lines d0'–d3'. At a time t2 following the time t1, the first control signal po0z changes from H to L. This prompts the four delayed flip-flops 401–404 of the first register 450 to latch the data on the data-bus lines d0'–d3'. At a time t3, the second control signal changes from L to H, prompting the four delayed flip-flops 405–408 of the second register 460 to acquire the data latched by the delayed flip-flops 401–404, respectively. At a time t4, the second control signal changes from H to L, so that the four delayed flip-flops 405–408 latch the acquired data. After this, the first control signal changes from L to H. This change makes the four delayed flop-flops 401–404 ready to accept data on the data-bus lines d0'–d3'. In this manner, the parallel data on the databus lines d0'–d3' is transferred to the first register 450 and then to the second register 460.

The data latched by the second register 460 is supplied to the 4-bit-to-2-bit-conversion circuit 470, where the 4-bit parallel data is converted into 2-bit parallel data. The 4-bit-to-2-bit-conversion circuit 470 includes delayed flip-flops 409–411 and output-buffer circuits 420–423. The 4-bit-to-2-bit-conversion circuit 470 receives four control-clock signals psclk0z–psclk3z, which control output timings of the output-buffer circuits 420–423 and data-latch timings of the delayed flip-flops 409–411. An output line of the output-buffer circuit 420 and an output line of the output-buffer circuit 422 are commonly connected to a node dd0. This is based on a wired-OR connection. When the output-buffer circuit 420 outputs data, the output of the output-buffer 422 is placed in a high-impedance condition. When the output-buffer circuit 422 outputs data, on the other hand, the output of the output-buffer 420 is placed in a high-impedance condition. The 4-bit-to-2-bit-conversion circuit 470 outputs a 2-bit data at the nodes dd0 and dd1, so that the 2-bit data is supplied to the data-output-timing switch 480. The data-output-timing switch 480 includes two switches swdd0 and swdd1, which are controlled in terms of an ON/OFF condition thereof by output-control-clock signals outp0z and outp1z. The data-output-timing switch 480 first closes the switch swdd0 so as to transfer the data bit at the node dd0 to the latch&level-shifter circuit 430 provided at the next stage, and, then, closes the switch swdd1 so as to transfer the data bit appearing at the node dd1 to the latch&level-shifter circuit 430. In this manner, the data-output-timing switch 480 transfers the two bits appearing at the nodes dd0 and dd1 successively one bit by one bit to the latch&level-shifter circuit 430. The latch&level-shifter circuit 430 latches the received data, and, then, converts the level of the received data to pass the data to the output buffer 19 shown in FIG. 4.

Figure 14:
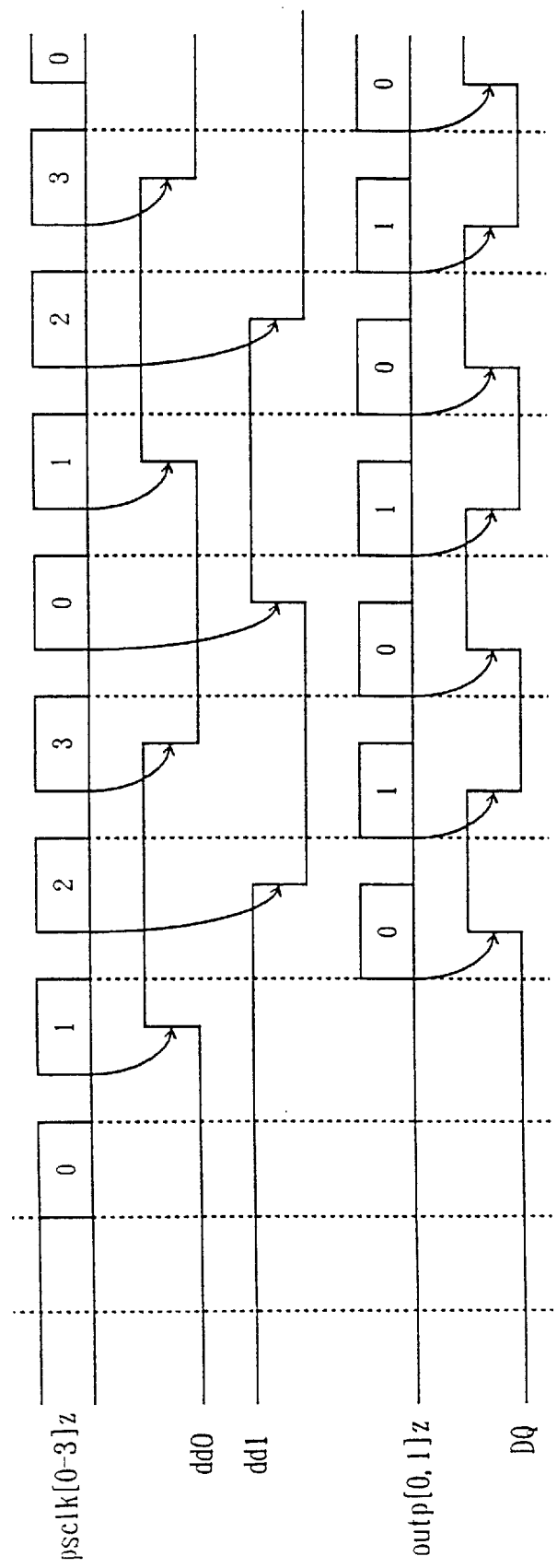
FIG. 14 is a timing chart showing operations of a 4-bit-to-2-bit-conversion circuit and a latch&level-shifter circuit shown in FIG. 11 when the burst length is 4.

FIG. 14 is a timing chart showing operations of the 4-bit-to-2-bit-conversion circuit 470 and the latch&level-shifter circuit 430 when the burst length BL is 4. In the following, operations of these circuits will be described in detail with reference to FIG. 14.

At an initial state, the four DFFs 405–408 of the second register 460 have latched data stored therein.

The four control-clock signals psclk0z–psclk3z for controlling operations of the 4-bit-to-2-bit-conversion circuit 470 supply H pulses in turn in an order of psclk1z, psclk2z, psclk3z, and paclk0z as shown in FIG. 14. When psclk1z becomes H, the output-buffer circuit 420 outputs the node dd0 data received from the DFF 405. At the same time, the DFF 409 latches data output from the DFF 406. When psclk2 becomes H, the output-buffer circuit 421 outputs to the node dd1 data received from the DFF 409. At the same time, the DFF 410 latches data output from the DFF 407. Such operations as described above are repeated, so that the nodes dd0 and dd1 will have data appearing in turn as shown in FIG. 14 as output data of the 4-bit-to-2-bit-conversion circuit 470.

The DFFs 409–411 of the 4-bit-to-2-bit-conversion circuit 470 are provided in order to achieve continuous data output from the data-output nodes DQ without any break. To this end, the DFFs 409–411 allow the second register 460 to latch a next set of data while the 4-bit-to-2-bit-conversion circuit 470 is attending to the conversion of a current set of data.

The two output-control-clock signals outp0z and outp1z for controlling operations of the data-output-timing switch 480 supply H pulses in turn at such timings as shown in FIG. 14. When new data appears at the node dd0, outp0z becomes H after a predetermined delay. The switch swdd0 is thus switched ON to transfer the data at the node dd0 to the latched&level-shifter circuit 430. When new data appears at the node dd1, outp1z becomes H after a predetermined delay. The switch swdd1 is thus switched ON to transfer the data of the node dd1 to the latch&level-shifter circuit 430. This operation is repeated again and again so as to transfer the data at the nodes dd0 and dd1 alternately to the latch&level-shifter circuit 430 on a sequential basis, thereby performing the 2-bit-to-1-bit conversion.

What is described above corresponds to a case in which the burst length BL is 4. FIG. 15A and FIG. 15B are tables showing operation conditions of the four control-clock signals psclk0z–psclk3z and the two output-control-clock signals outp0z and outp1z with respect to cases in which the burst length is 1, 2 and 4.

In the case of the burst length BL being 4, all the four control-clock signals psclk0z–psclk3z and the two output-control-clock signals outp0z and outp1z exhibit clocking operations. As a result, the 4-bit parallel data output from the four DFFs 405–408 of the second register 460 is converted into serial data.

When the burst length BL is 2, two control-clock signals psclk1z and psclk2z and the two output-control-clock signals outp0z and outp1z exhibit clocking operations. When the burst length BL is 2, as previously described, data is supplied only to the nodes d0' and d1', and the other nodes d2' and d3' receive no data. Because of this, only the control-clock signals and the output-control-clock signals that are necessary for outputting data from the nodes d0' and d1' to the outside are allowed to exhibit clock operations.

When the burst length BL is 1, one control-clock signal psclk1z and one output-control-clock signal outp0z exhibit clocking operations. As previously described, when the burst length BL is 1, data is supplied only to the node d0', and the other nodes d1'–d3' receive no data. Because of this, only the control-clock signal and the output-control-clock signal that are necessary for outputting data from the node d0' to the outside are allowed to exhibit clock operations.

In this embodiment, the 4-bit data output from the second register 460 is converted into 2-bit data by the 4-bit-to-2-bit-conversion circuit 470, and, then, the 2-bit data is converted into 1-bit data via the data-output-timing switch 480 and the latch&level-shifter circuit 430. Namely, a process of parallel-to-serial data conversion is performed by dividing the process into two steps and by carrying out the two steps successively.

Alternatively, the output-buffer circuits 420–423 of the 4-bit-to-2-bit-conversion circuit 470 may have four outputs thereof connected together via a wired-OR connection, and the data-output-timing switch 480 may be comprised of only one switch. In this case, the data-output-timing switch 480 is implemented by a relatively simple structure using only one switch.

If the clock-signal frequency is increased in an attempt to achieve a faster operation, it becomes increasingly different to generate an output-control-clock signal outp#z corresponding to only one switch swdd because of demand for an excessively higher frequency. In such a case, the data-output-timing switch 480 may be comprised of two switches as shown in FIG. 11, and the two output-control-clock signals outp0z and oup1z may be used for controlling these two switches. In this configuration, the two output-control-clock signals are required to have only half the frequency of the only one output-control-clock signal described above.

Figure 16A:
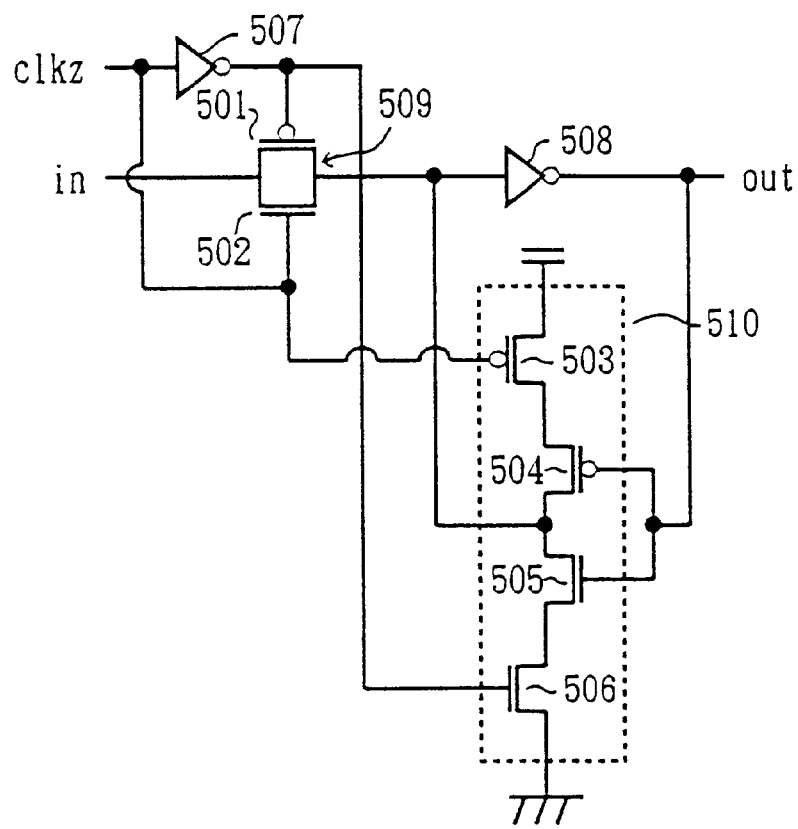
FIG. 16A is a circuit diagram of any one of delayed flip-flops DFF shown in FIG. 11.
Figure 16B:
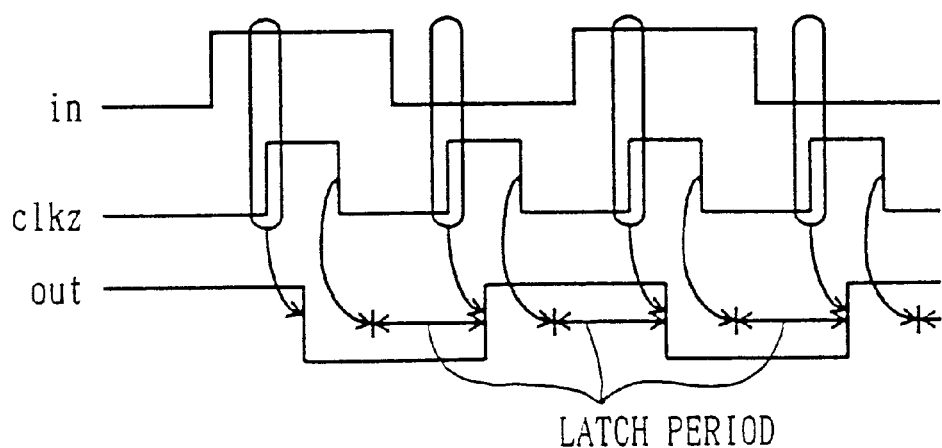
FIG. 16B is a timing chart showing operations of the configuration of FIG. 16A.

FIG. 16A is a circuit diagram of any one of the delayed flip-flops DFF shown in FIG. 11. FIG. 16B is a timing chart showing operations of the configuration of FIG. 16A.

The delayed flip-flop DFF includes a transfer gate comprised of a PMOS transistor 501 and an NMOS transistor 502, inverters 507 and 508, and a clocked inverter made up of PMOS transistors 503 and 504 and NMOS transistors 505 and 506.

When a clock signal clkz corresponding to one of the control signals po0z, po1z and psclk0z–psclk3z shown in FIG. 11 is high, the transfer gate 509 is switched ON, so that the DFF acquires input data in. While this happens, the clocked inverter 510 is in a switched-OFF condition. When the clock signal clkz becomes L, the transfer gate 509 is switched OFF, so that the input data in is separated from the DFF. At the same time, the clocked inverter 510 is activated so as to form a latch with the inverter 508. This latch latches the data which is acquired by the DFF at a moment when the clock signal clkz becomes L.

Figure 17A:
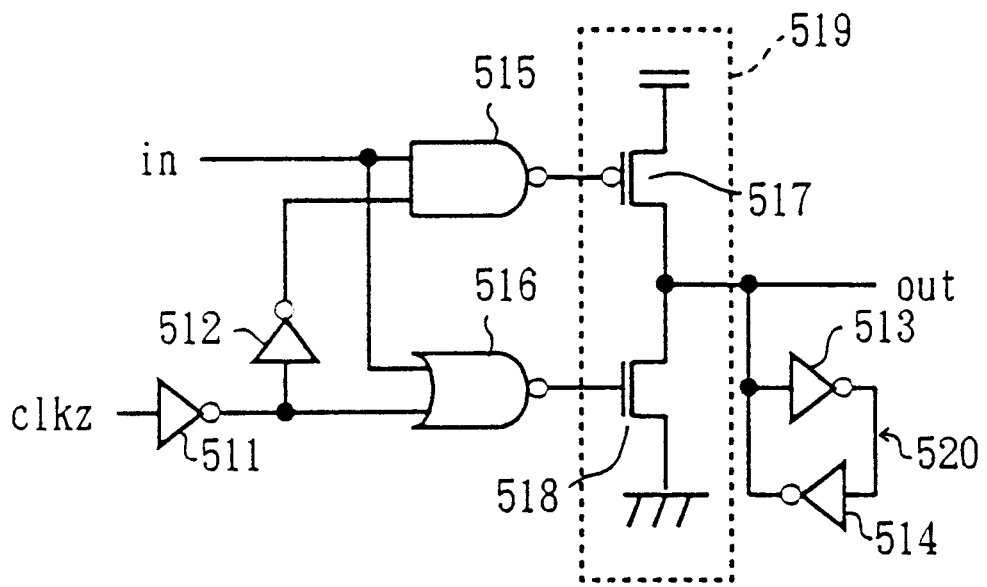
FIG. 17A is a circuit diagram of any one of the output buffers shown in FIG. 11.
Figure 17B:
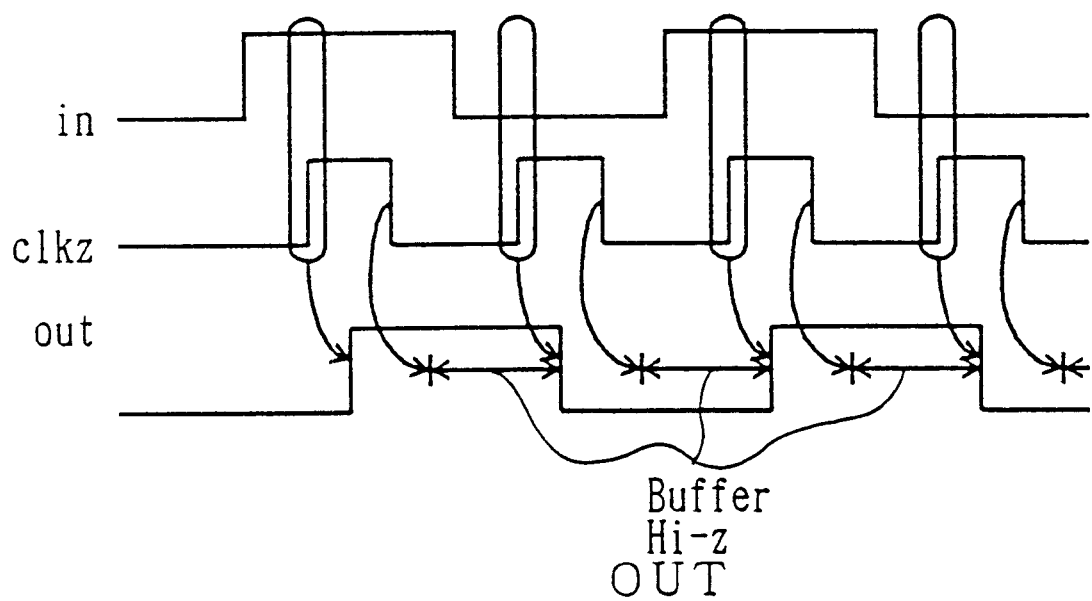
FIG. 17B is a timing chart showing operations of the configuration of FIG. 17A.

FIG. 17A is a circuit diagram of any one of the output buffers 420–423 shown in FIG. 11. FIG. 17B is a timing chart showing operations of the configuration of FIG. 17A.

An output-buffer circuit of this figure includes inverters 511 and 512, a NAND circuit 515, a NOR circuit 516, a buffer circuit 519 comprised of a PMOS transistor 517 and an NMOS transistor 518, and a latch circuit 520 comprised of inverters 513 and 514.

When a clock signal clkz corresponding to one of the clock signals po0z, po1z, and psclk0z–psclk3z shown in FIG. 11 becomes H, the NAND circuit 515 and the NOR circuit 516 function as an inverter, respectively, so that output data having the same phase as input data appears at an output node out. This output data is stored in the latch circuit 520. When the clock signal clk is changed to L, the PMOS transistor 517 and the NMOS transistor 518 are turned OFF, thereby leaving the output node in a high-impedance condition.

Figure 18:
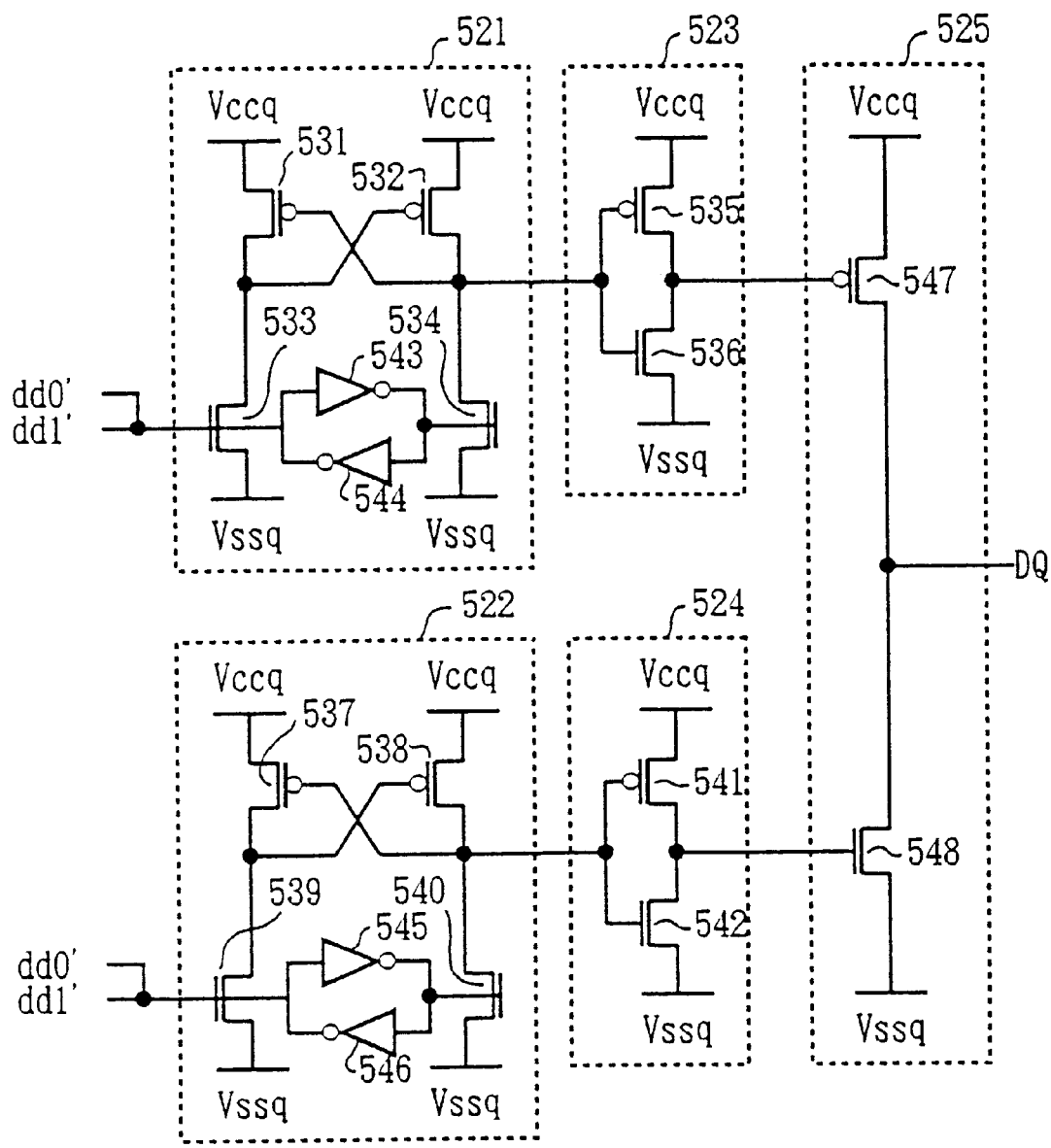
FIG. 18 is a circuit diagram showing a configuration of the latch&level-shifter circuit shown in FIG. 11.

FIG. 18 is a circuit diagram showing a configuration of the latch&level-shifter circuit 403 shown in FIG. 11. In this figure, a portion 525 comprised of a PMOS transistor 547 and an NMOS transistor 548 corresponding to the data output buffer 19.

The latch&level-shifter circuit 403 includes PMOS transistors 531, 532, NMOS transistors 533 and 534, and inverters 543 and 544, all of which together form a level-shift circuit 521 equipped with a latch. The latch&level-shifter 522 having an identical configuration, an inverter 523 made up of a PMOS transistor 535 and an NMOS transistor 536, and an inverter 524 comprised of a PMOS transistor 541 and an NMOS transistor 542. In the figure, Vccq and Vssq are lower lines separate from power lines Vii and Vss for internal circuits, so that Vccq is provided with a voltage different from that of Vii, for example.

Gates of the PMOS transistors 533 and 539 are connected to both the output dd0' and the output dd1' of the data-output-timing switch 480 (see FIG. 11). When data is supplied from the output line dd0', for example, H data of the output line dd0' results in H data being output at the data-output node DQ. By the same token, L data of the output line dd0' results in L data being output at the data-output node DQ.

Alternatively, the level-shift circuit 522 and the inverter 524 may be removed, and the output of the inverter 523 may be supplied as a common input to the gate of the PMOS transistor 547 and to the gate of the NMOS transistor 548. It should be noted, however, that the configuration of FIG. 18 is preferred to this alternative configuration if there is a need to place the data-output node DQ in a high-impedance state.

Further, instead of connecting the gate of the NMOS transistor 539 to the output lines dd0' and dd1', another form of connections may be provided. Namely, the data-output-timing switch 480 shown in FIG. 11 may be provided with another set of switches swdd00 and swdd11 which are controlled by the output-control-clock signals outp0z and outp1z, respectively, and the gate of the NMOS transistor 539 may be connected to the node dd0 via the switch swdd00 and to the node dd1 via the switch swdd11.

Figure 19:
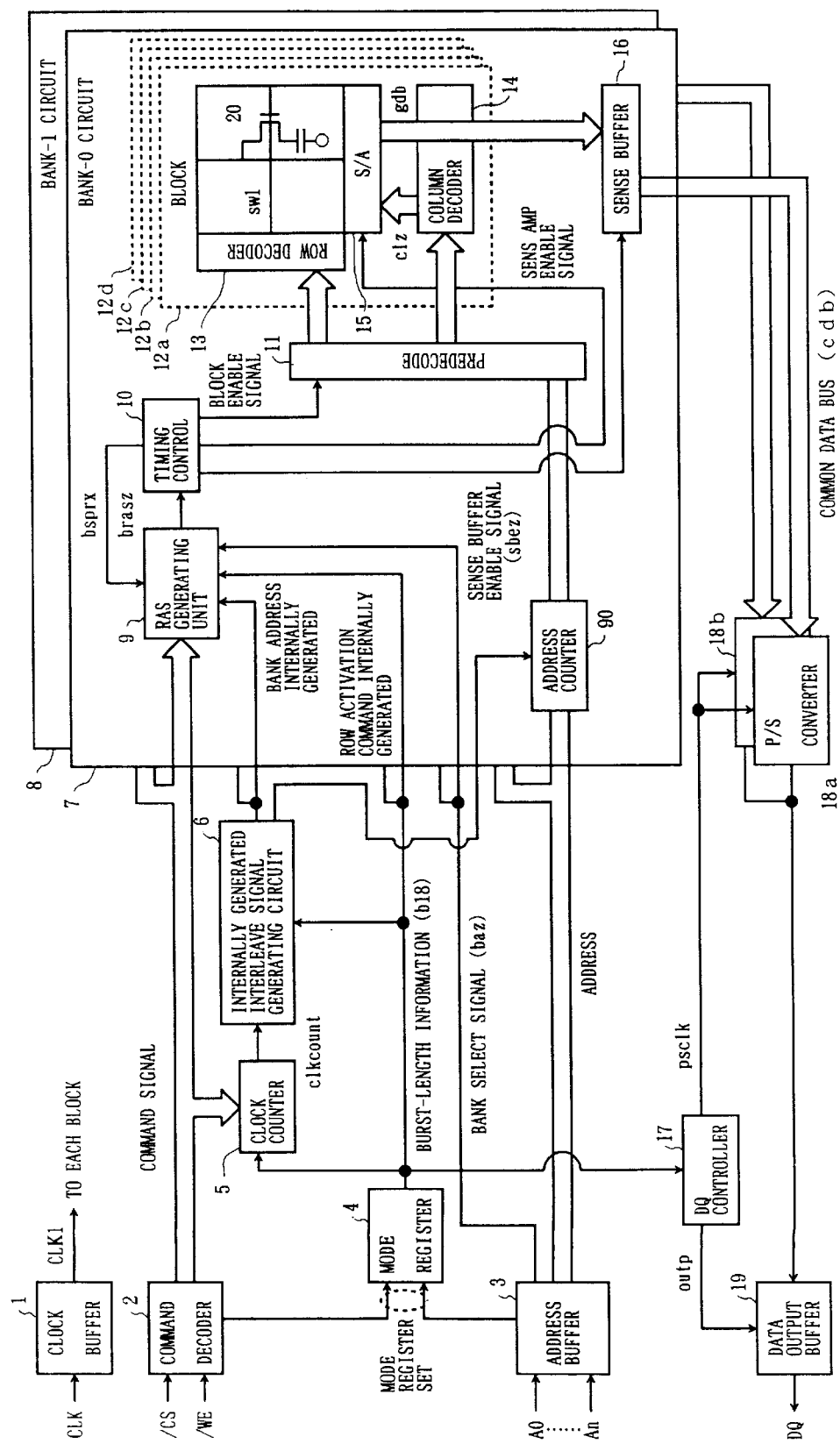
FIG. 19 is a block diagram of a second embodiment of the present invention.

A description will now be given of an FCRAM according to another embodiment of the present invention by referring to FIGS. 19 and 20.

The aforementioned embodiment of the present invention shown in FIG. 4 has the burst length BL equal to 4 or 8. The embodiment shown in FIGS. 19 and 20 is a memory having a burst length equal to or more than 16. In FIG. 19, parts that are the same as those shown in the previously described figures are given the same reference numbers.

In the FCRAM shown in FIG. 4, the bank-0 circuit 7 and the bank-1 circuit 8 are automatically enabled in response to one read command, so that 8-bit burst data can be output. In the FCRAM shown in FIG. 19, the bank-0 circuit 7 and the bank-1 circuit 8 are selected alternatively and repeatedly, so that 16-bit burst data can be output. That is, the circuits 7 and 8 are enabled in the following sequence: ① circuit 7→② circuit 8→③ circuit 7→④ circuit 8. In this sequence, the circuit 7 is required to be supplied with different addresses in phases ① and ③, and the circuit 8 is required to be supplied with different addresses in phases ② and ④. For the above requirement, an address counter 90 is provided in the bank-0 circuit 7 as shown in FIG. 19, and similarly an address counter (not shown) identical to the address counter 90 is provided in the bank-1 circuit 8. The address counter 90 receives the address signal from the address buffer 3 and automatically counts up a predetermined one-bit of the row address in response to the RAS signal bras0z for the bank 0 internally generated by the internal interleave generating circuit 6 shown in FIG. 5.

Figure 20:
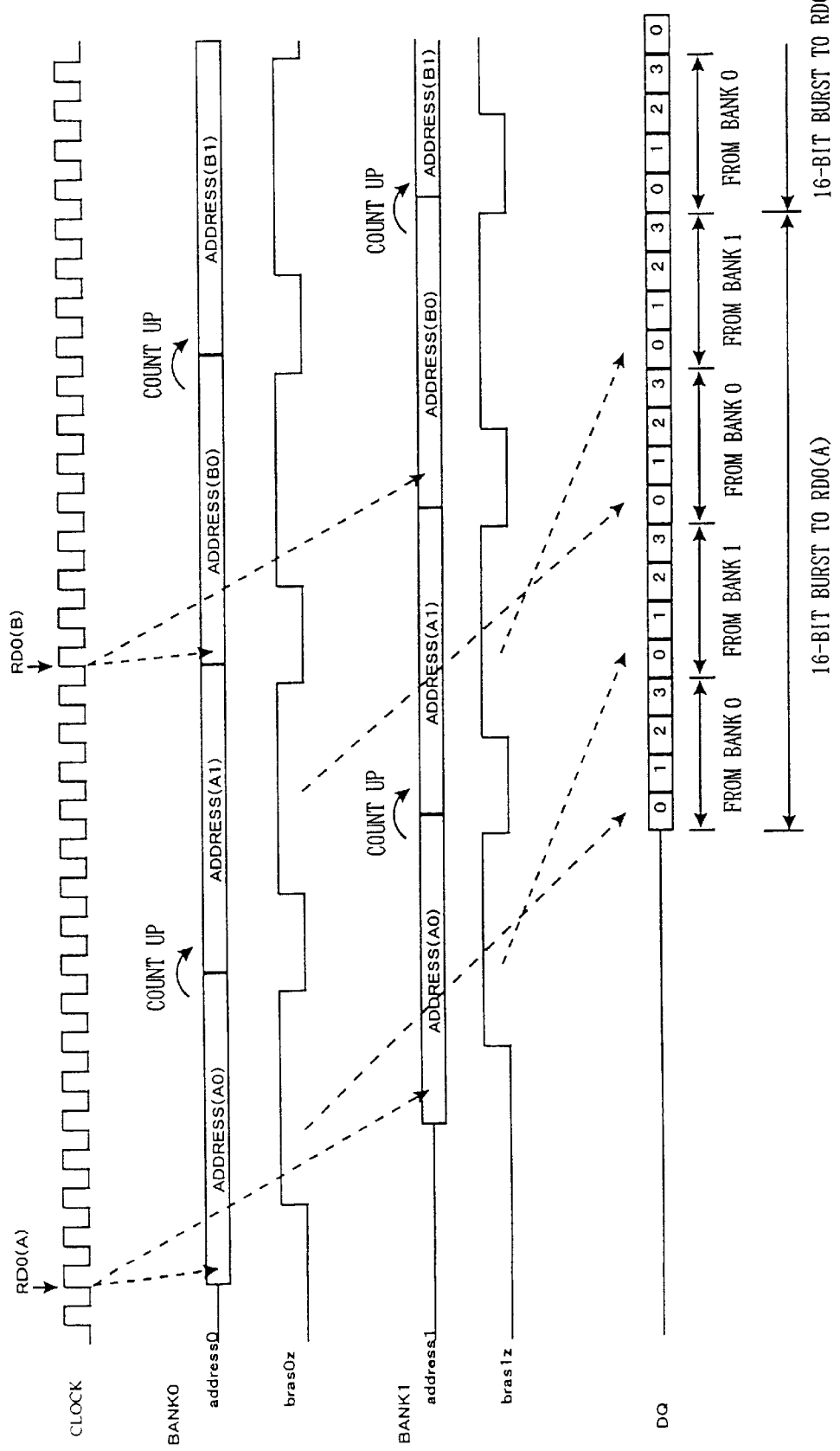
FIG. 20 is a timing chart of an operation of the second embodiment of the present invention.

As shown in FIG. 20, an address A0 is latched together with the read command RD0(A), and the bank 0 and the bank 1 are successively enabled with respect to address A0 by the RAS signals bras0z and bras1z internally generated by the internal interleave generating circuit 6. When a given timing elapses after the RAS signal bras0z for the bank 0 is generated, the address counter 90 increments the address A0 by 1, so that an address A1 is generated and output to the predecoder 11. The addresses A0 and A1 specify the different word lines. The RAS signal bras0z is once disabled to perform the precharge by the timing controller 10 shown in FIG. 4 before the read operation associated with the address A1 is performed.

The same operation as described above with regard to the bank 0 is performed in the bank 1. That is, when the given timing elapses after the RAS signal bras1z for the bank 1 is generated, the address counter 90 of the bank-1 circuit 8 increments the address A0 by 1, so that the address A1 is generated and output to the predecoder 11 of the bank-1 circuit 8. The RAS signal bras1z is once disabled to perform the precharge by the timing controller 10 of the bank-1 circuit 8 shown in FIG. 4 before the read operation associated with the address A1 is performed.

Hence, as shown in FIG. 20, two items of 4-bit serial data related to the address A0 are successively read from the banks 0 and 1, and two items of 4-bit serial data related to the address A1 are successively read from the banks 0 and 1. Hence, 16-bit burst data can be output via the data output terminal DQ in response to one read address RD0(A).

The above operations are repeated each time one read command is received.

When the burst length is equal to 32, each of the address counters 90 provided in the respective banks performs the count-up operation three times in response to one read command. Hence, 32-bit burst data can be output via the data output terminal DQ each time one read command is received.

In the above description, the burst length equal to 4 serves as a predetermined or reference burst length, and the burst length equal to 8 serves as another or second reference burst length. When the burst length to be used is equal to 8, the bank interleave operation is performed. When the burst length to be used is longer than the burst length of 8, the bank interleave operation and the address increment operation are carried out.

The present invention is not specifically disclosed embodiments, and variations and modifications may be made without departing from the scope of the present invention.

What is claimed is:

1. A semiconductor memory comprising:
   memory cell blocks;
   a burst-length information generating circuit which generates burst-length information based on a burst length; and
   a block enable circuit which receives the burst-length information, said block enable circuit selectively enabling one of the memory cell blocks when the burst length is equal to or shorter than a predetermined burst length and selectively enabling a plurality of memory cell blocks based on the burst length when the burst length is longer than the predetermined burst length.

2. The semiconductor memory as claimed in claim 1, wherein a cycle time necessary for a data read operation when the plurality of memory cells are enabled is equal to that necessary for a data read operation when said one of the memory cell blocks is enabled.

3. The semiconductor memory as claimed in claim 1, further comprising an address decoder which selects one of banks provided in the semiconductor memory in accordance with an address signal supplied from an outside of the semiconductor memory,
   wherein, when the burst length is equal to or shorter than the predetermined burst length, the block enable circuit selects said one of the memory cell blocks from said one of the banks selected by the address decoder.

4. The semiconductor memory as claimed in claim 3, wherein, when the burst length is longer than the predetermined burst length, the block enable circuit invalidates said one of the banks selected by the address decoder and automatically selects a plurality of banks so that each of the plurality of memory cell blocks is selected from a respective one of the plurality of banks.

5. The semiconductor memory as claimed in claim 1, further comprising a pulse generating circuit which periodically generates a pulse signal when the burst length is longer than the predetermined burst length,
   wherein the block enable circuit sequentially enables the plurality of memory cell blocks one by one each time the pulse signal is generated.

6. The semiconductor memory as claimed in claim 1, wherein the block enable circuit generates a precharge signal when a given time elapses after starting to enable a selected memory cell block, so that the selected memory cell block is automatically precharged.

7. The semiconductor memory as claimed in claim 1, wherein each of the memory cell blocks comprises:
   a word select circuit which generates a word line select signal for selecting a word line corresponding to an address signal supplied from an outside of the semiconductor memory;
   sense amplifiers which sense and hold data stored in memory cells connected to a selected word line; and
   a column select circuit which generates column select signals for simultaneously selecting a plurality of bits from among the data held by the sense amplifiers,
   wherein the plurality of memory cell blocks selectively enabled sequentially output respective parallel data each composed of the plurality of bits simultaneously selected by the respective column select circuit in an order of enabling the plurality of memory cell blocks one by one.

8. The semiconductor memory as claimed in claim 7, wherein the predetermined burst length is equal to the number of the plurality of bits forming the parallel data.

9. The semiconductor memory as claimed in claim 7, further comprising a parallel-to-serial converter circuit which converts the parallel data output from the plurality of memory cell blocks into serial data on the basis of the burst length information.

10. The semiconductor memory as claimed in claim 9, wherein, when the burst length is longer than the predetermined burst length, the parallel-to-serial converter circuit increases a transmission rate of the serial data based on the burst length.

11. The semiconductor memory as claimed in claim 1, wherein the burst-length information generating circuit comprises a register in which the burst-length information to be used is registered.

12. The semiconductor memory as claimed in claim 1, wherein:
   the burst-length information generating circuit comprises a plurality of units respectively provided to burst lengths that can be used in the semiconductor memory;
   each of the plurality of units comprises a circuit and a fuse for connecting the circuit to a power supply; and
   fuses of the plurality of units are selectively cut in accordance with the burst length used.

13. The semiconductor memory as claimed in claim 1, wherein:
   the burst-length information generating circuit comprises at least one unit made up of a circuit and pads; and
   a wire bonding is provided between one of the pads and the circuit in accordance with the burst length used.

14. The semiconductor memory as claimed in claim 1, wherein:
   the burst-length information generating circuit comprises at least one unit made up of a circuit and switches; and
   the switches are controlled in accordance with the burst length used.

15. The semiconductor memory as claimed in claim 1, further comprising an address counter which generates, from a first address supplied from an outside of the semiconductor memory, a second address,
   wherein:
   when the burst length is longer than another predetermined burst length longer than the predetermined burst length, the block enable circuit repeatedly enables the plurality of memory cell blocks a number of times based on the burst length to be used in accordance with the first and second address signals.

16. The semiconductor memory as claimed in claim 15, wherein the first and second addresses select different word lines.

* * * * *